(12) United States Patent
Ohshimizu et al.

(10) Patent No.: US 10,696,816 B2
(45) Date of Patent: Jun. 30, 2020

(54) POLYESTER RESIN COMPOSITION FOR REFLECTIVE MATERIAL, AND REFLECTIVE MATERIAL COMPRISING SAME

(71) Applicant: MITSUI CHEMICALS, INC., Tokyo (JP)

(72) Inventors: Kaoru Ohshimizu, Omuta (JP); Hideto Ogasawara, Sodegaura (JP); Hiroki Ebata, Yokohama (JP); Takashi Hama, Chiba (JP); Fumio Kageyama, Ichihara (JP); Shintaro Mitsunaga, Hiroshima (JP); Nobuhiro Takizawa, Kamakura (JP); Akinori Amano, Chiba (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 513 days.

(21) Appl. No.: 15/300,464

(22) PCT Filed: Mar. 26, 2015

(86) PCT No.: PCT/JP2015/001709
§ 371 (c)(1),
(2) Date: Sep. 29, 2016

(87) PCT Pub. No.: WO2015/151463
PCT Pub. Date: Oct. 8, 2015

(65) Prior Publication Data
US 2017/0174863 A1    Jun. 22, 2017

(30) Foreign Application Priority Data

Mar. 31, 2014 (JP) ................................. 2014-072275
Aug. 25, 2014 (JP) ................................. 2014-170545
Dec. 10, 2014 (JP) ................................. 2014-250260

(51) Int. Cl.
$C08K\ 3/22$ (2006.01)
$C08G\ 63/199$ (2006.01)
(Continued)

(52) U.S. Cl.
CPC .............. $C08K\ 3/22$ (2013.01); $C08G\ 63/183$ (2013.01); $C08G\ 63/199$ (2013.01); $C08K\ 3/013$ (2018.01);
(Continued)

(58) Field of Classification Search
CPC ........ C08K 3/22; C08L 67/00; C08L 2666/18
(Continued)

(56) References Cited

U.S. PATENT DOCUMENTS 7,105,627 B1    9/2006   Kannan et al.
2007/0232779 A1*  10/2007  Moody .................. B32B 27/08
                                                          528/272

(Continued)

FOREIGN PATENT DOCUMENTS

CN    101511907 A    8/2009
CN    101671433 A  *  3/2010 ........... C08G 63/199
(Continued)

OTHER PUBLICATIONS

Yuan et al. CN 101671433 A, published Mar. 17, 2010, EPO machine translation. (Year: 2010).*
(Continued)

*Primary Examiner* — Jane L Stanley
(74) *Attorney, Agent, or Firm* — Buchanan Ingersoll & Rooney PC

(57) ABSTRACT

The present invention addresses the problem of providing a polyester resin composition for reflective materials which gives a reflective material having a high reflectance. The polyester resin composition for reflective materials comprises: a polyester resin (A) comprising an alicyclic dicar-
(Continued)

boxylic acid ingredient unit (a1) and an aliphatic diol ingredient unit (b1); and a white pigment (B). The amount of the alicyclic dicarboxylic acid ingredient unit (a1) is 50 mol % or more of the amount of all the dicarboxylic acid ingredient units (a) in the polyester resin (A), and the amount of the aliphatic diol ingredient unit (b1) is 50 mol % or more of the amount of all the diol ingredient units (b) in the polyester resin (A). The alicyclic dicarboxylic acid ingredient unit (a1) comprises the cis and trans forms of cis-trans isomers, the proportion of the cis form determined by NMR being 20 mol % or higher.

15 Claims, 1 Drawing Sheet

(51) Int. Cl.
  G02B 5/02       (2006.01)
  C08K 5/14       (2006.01)
  C08K 3/013      (2018.01)
  C08G 63/183     (2006.01)
  C08K 7/14       (2006.01)
  C08K 13/04      (2006.01)
  C08L 67/02      (2006.01)
  H01L 33/60      (2010.01)

(52) U.S. Cl.
  CPC ............ C08K 5/14 (2013.01); C08K 7/14 (2013.01); C08K 13/04 (2013.01); C08L 67/02 (2013.01); G02B 5/0236 (2013.01); G02B 5/0268 (2013.01); G02B 5/0284 (2013.01); H01L 33/60 (2013.01); C08K 2003/2241 (2013.01)

(58) Field of Classification Search
  USPC ...................................................... 524/539
  See application file for complete search history.

(56) References Cited

U.S. PATENT DOCUMENTS

| | | | |
|---|---|---|---|
| 2013/0261243 A1* | 10/2013 | Nagaoka | C08F 283/01 524/399 |
| 2014/0167091 A1 | 6/2014 | Ogasawara et al. | |
| 2016/0060479 A1* | 3/2016 | Konno | C08K 3/36 257/98 |
| 2016/0090482 A1 | 3/2016 | Ebata et al. | |
| 2018/0065392 A1* | 3/2018 | Wu | C08K 9/06 |

FOREIGN PATENT DOCUMENTS

| | | |
|---|---|---|
| EP | 2995648 A1 | 3/2016 |
| JP | 06-038520 B2 | 5/1994 |
| JP | 2005-146103 A | 6/2005 |
| JP | 2005-154619 A | 6/2005 |
| JP | 2007-197651 A | 8/2007 |
| JP | 2008-063417 A | 3/2008 |
| JP | 2008-542506 A | 11/2008 |
| JP | 2008-308641 A | 12/2008 |
| JP | 2011-021128 A | 2/2011 |
| JP | 2013-237183 A | 11/2013 |
| JP | 2014-148615 A | 8/2014 |
| JP | 2015-074763 A | 4/2015 |
| WO | WO 2013/018360 A1 | 2/2013 |

OTHER PUBLICATIONS

Extended Search Report issued by the European Patent Office in corresponding European Patent Application No. 15772943.5 dated Oct. 5, 2017 (6 pages).

International Search Report (PCT/ISA/210) dated Jun. 16, 2015, by the Japan Patent Office as the International Searching Authority for International Application No. PCT/JP2015/001709.

Written Opinion (PCT/ISA/237) dated Jun. 16, 2015, by the Japan Patent Office as the International Searching Authority for International Application No. PCT/JP2015/001709.

* cited by examiner

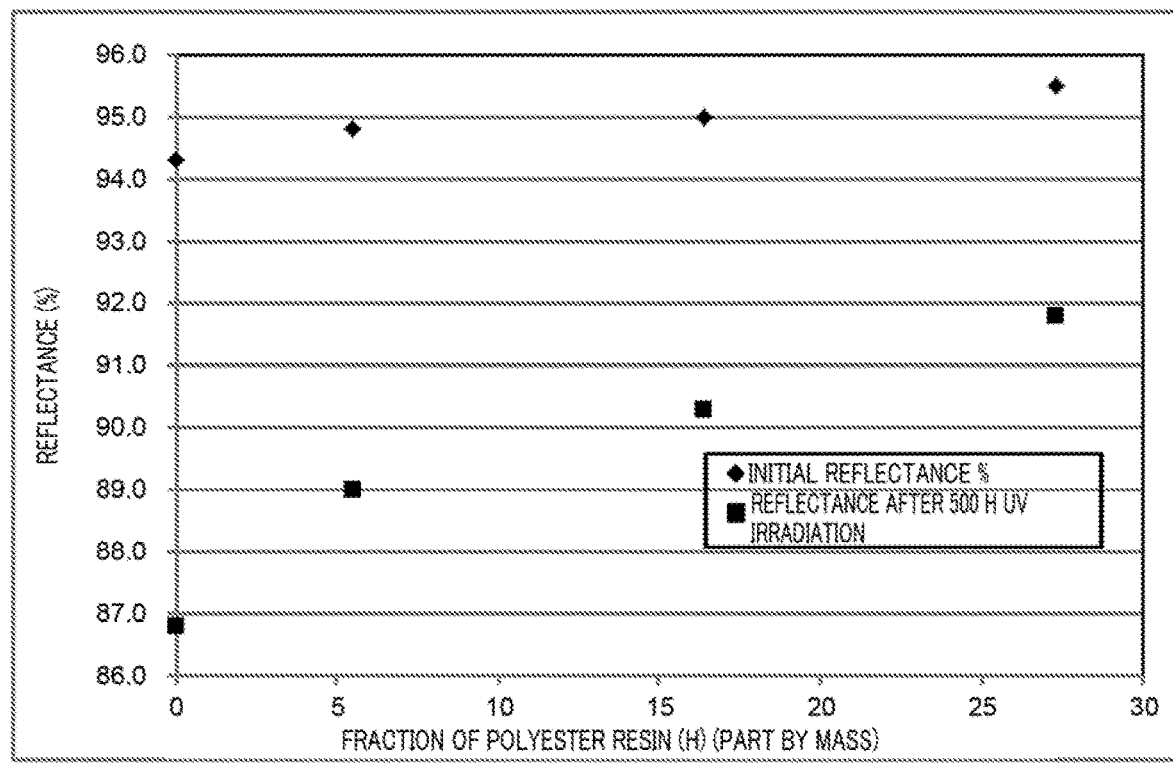

POLYESTER RESIN COMPOSITION FOR REFLECTIVE MATERIAL, AND REFLECTIVE MATERIAL COMPRISING SAME

TECHNICAL FIELD

The present invention relates to a polyester resin composition for a reflective material, and a reflective material including the same.

BACKGROUND ART

Light sources such as light-emitting diodes (hereinafter, abbreviated as LEDs) and organic ELs have been widely used as illumination as well as backlights of displays, taking advantage of features of low power consumption and long life, and are likely to be increasingly used in the future. In order to efficiently utilize light from these light sources, reflective materials to reflect light from the light sources have been utilized in various situations. In addition, reflective materials are required to exhibit high reflectance under the operating environment.

In recent years, due to the requirements for cost reduction of products, it is required to decrease the number of light sources (LED packages) installed in final products such as televisions and displays. Accordingly, it is required to enhance the reflectivity of reflective materials and more efficiently utilize light from light sources.

For the material for such a reflective material, a resin composition is proposed, for example, in which a glass fiber or titanium oxide is blended in a melt-processable polyester such as an aromatic polyester and an aromatic polyester amide (e.g., PTL 1). The resin composition is satisfactory in heat resistance and dimensional stability to some degree. However, it is difficult to sufficiently enhance the reflectance of a reflective material consisting of the resin composition.

In view of this, a resin composition for a reflective material is also proposed, the resin composition containing a polyamide resin containing a structure derived from a cyclohexanedicarboxylic acid, titanium oxide, and a reinforcing material (PTL 2). The resin composition enables to obtain a reflective material having high whiteness and high resistance to reflow soldering heat.

On the other hand, for a material for optical films is also proposed a completely-alicyclic polyester containing a structural unit derived from a cyclohexanedicarboxylic acid and a structural unit derived from a cyclohexanedimethanol (PTL 3). The technique allows the proportion of the trans-form in the structural unit derived from a cyclohexanedicarboxylic acid to increase to enhance the heat resistance of a film to be obtained.

CITATION LIST

Patent Literature

PTL 1
Japanese Patent Application Laid-Open No. 6-38520
PTL 2
Japanese Patent Application Laid-Open No. 2011-21128
PTL 3
Japanese Patent Application Laid-Open No. 2005-154619

SUMMARY OF INVENTION

Technical Problem

However, reflective materials consisting of the resin composition according to the above-mentioned PTL 2 are easily discolored in heating and the light reflectance is likely to be lowered over time. Further, reflective materials consisting of the resin composition have a problem of dimensional change and reduction in rigidity due to water absorption. On the other hand, the completely-alicyclic polyester according to PTL 3, although being excellent in heat resistance and light resistance, cannot enhance the light reflectance when being used for a reflective material.

The present invention has been made in view of the above-described circumstances. Specifically, the present invention provides a polyester resin composition for a reflective material which enables to obtain a reflective material having high reflectance. In addition, the present invention provides a reflective material containing the resin composition.

Solution to Problem

As a result of intensive studies in view of such circumstances, the present inventors have found that a polyester resin containing an alicyclic dicarboxylic acid component unit and an aliphatic diol component unit in which the proportion of the cis-form contained in the alicyclic dicarboxylic acid component unit is 20% by mole or more allows a reflective material obtained from the composition to be enhanced in reflectance, and have completed the present invention.

In addition, the present inventors have found that combining a polyester resin (G) having a high melting point or glass transition temperature and a polyester resin (H) containing an alicyclic dicarboxylic acid component unit derived from an alicyclic dicarboxylic acid; and setting the content of the polyester resin (H) in a specific range enable to obtain a polyester resin composition for a reflective material having very high light resistance and high reflectance as well as high heat resistance, and have completed the present invention.

That is, a first aspect of the present invention relates to a polyester resin composition for a reflective material as set forth below, and a reflective materials containing the same.

[1] A polyester resin composition for a reflective material containing a polyester resin (A) containing an alicyclic dicarboxylic acid component unit (a1) derived from an alicyclic dicarboxylic acid and an aliphatic diol component unit (b1) derived from an aliphatic diol; and a white pigment (B), in which the amount of the alicyclic dicarboxylic acid component unit (a1) is 50% by mole or more based on the amount of the total dicarboxylic acid component unit (a) in the polyester resin (A), the amount of the aliphatic diol component unit (b1) is 50% by mole or more based on the amount of the total diol component unit (b) in the polyester resin (A), and the alicyclic dicarboxylic acid component unit (a1) contains cis-trans isomers in cis-form and trans-form, and the proportion of the cis-form measured by NMR is 20% by mole or more.

[2] The polyester resin composition for a reflective material according to [1], wherein the aliphatic diol component unit (b1) contains an alicyclic diol component unit (b1') derived from an alicyclic diol, and the alicyclic dicarboxylic acid component unit (a1) contains cis-trans isomers in cis-form and trans-form, and a proportion of the cis-form measured by NMR is 20% by mole or more and 50% by mole or less.

[3] The polyester resin composition for a reflective material according to [1] or [2], wherein the alicyclic dicarboxylic acid component unit (a1) contains 30 to 100% by mole of a cyclohexanedicarboxylic acid component unit (a1-1)

and 0 to 70% by mole of an alicyclic dicarboxylic acid component unit (a1-2) exclusive of the cyclohexanedicarboxylic acid component unit, wherein a total of the cyclohexanedicarboxylic acid component unit (a1-1) and the alicyclic dicarboxylic acid component unit (a1-2) is 100% by mole, and the aliphatic diol component unit (b1) contains 30% by mole to 100% by mole of a cyclohexanedimethanol component unit (b1-1) and 0 to 70% by mole of an aliphatic diol component unit (b1-2) exclusive of the cyclohexanedimethanol component unit, wherein a total of the cyclohexanedimethanol component unit (b1-1) and the aliphatic diol component unit (b1-2) is 100% by mole.

[4] The polyester resin composition for a reflective material according to any one of [1] to [3], wherein the alicyclic dicarboxylic acid component unit (a1) contains a 1,4-cyclohexanedicarboxylic acid component unit derived from 1,4-cyclohexanedicarboxylic acid, and the aliphatic diol component unit (b1) contains a 1,4-cyclohexanedimethanol component unit derived from 1,4-cyclohexanedimethanol.

[5] The polyester resin composition for a reflective material according to any one of [1] to [4], wherein a content of the polyester resin (A) is 20 mass % or more and less than 80 mass % based on a total mass of the polyester resin composition for a reflective material, and a content of the white pigment (B) is 5 mass % or more and less than 50 mass % based on the total mass of the polyester resin composition for a reflective material.

[6] The polyester resin composition for a reflective material according to any one of [1] to [5], wherein the polyester resin (A) has no melting point (Tm) as measured by a differential scanning calorimeter in accordance with JIS-K7121.

[7] The polyester resin composition for a reflective material according to any one of [1] to [6], wherein the polyester resin (A) has an intrinsic viscosity [η] of 0.05 to 10 dl/g.

[8] The polyester resin composition for a reflective material according to any one of [1] to [7], further comprising 0.1 to 30 parts by mass of a peroxide (E) and 0.1 to 50 parts by mass of a crosslinking auxiliary agent (F) relative to 100 parts by mass of the polyester resin (A).

[9] The polyester resin composition for a reflective material according to [8], wherein the crosslinking auxiliary agent (F) is a compound having one or more ethylenically-unsaturated bonds in one molecule.

[10] The polyester resin composition for a reflective material according to [9], wherein the crosslinking auxiliary agent (F) is a compound having two or more ethylenically-unsaturated bonds and a triazine skeleton in one molecule.

[11] A crosslinked polyester resin composition for a reflective material obtained by melt-kneading the polyester resin composition for a reflective material according to any one of [8] to [10], the crosslinked polyester resin composition containing a crosslinked polyester resin (A') obtained by crosslinking at least a part of the polyester resin (A).

[12] A reflective material comprising the polyester resin composition for a reflective material according to any one of [1] to [10].

[13] The reflective material according to [12], which is a reflective material for a light-emitting diode element.

[14] A reflective material comprising the crosslinked polyester resin composition for a reflective material according to [11].

[15] The reflective material according to [14], which is a reflective material for a light-emitting diode element.

A second aspect of the present invention relates to a polyester resin composition for a reflective material as set forth below, and a reflective materials containing the same.

[16] A polyester resin composition for a reflective material comprising: a polyester resin (G) having a melting point (Tm) or glass transition temperature (Tg) of 250° C. or higher as measured by a differential scanning calorimeter (DSC); a polyester resin (H) containing an alicyclic dicarboxylic acid component unit (h1) derived from an alicyclic dicarboxylic acid and an aliphatic diol component unit (h2) derived from an aliphatic diol, with a proviso that the polyester resin (G) is not included; a white pigment (J); and an inorganic filler (K), wherein an amount of the polyester resin (H) is 3 to 30 parts by mass relative to 100 parts by mass of a total of the polyester resin (G), the polyester resin (H), the white pigment (J), and the inorganic filler (K).

[17] The polyester resin composition for a reflective material according to [16], wherein a content of the polyester resin (G) is 20 parts by mass or more and less than 50 parts by mass, a content of the polyester resin (H) is 3 parts by mass or more and less than 25 parts by mass, a content of the white pigment (J) is 10 parts by mass or more and less than 50 parts by mass, and a content of the inorganic filler (K) is 5 parts by mass or more and less than 40 parts by mass, each relative to 100 parts by mass of a total of the polyester resin (G), the polyester resin (H), the white pigment (J), and the inorganic filler (K).

[18] The polyester resin composition for a reflective material according to [16] or [17], wherein the aliphatic diol component unit (h2) contains an alicyclic diol component unit (h2).

[19] The polyester resin composition for a reflective material according to [18], wherein the alicyclic diol component unit (h2') contains a cis-form and a trans-form of cis/trans isomers and a proportion of the cis-form measured by NMR is 20% by mole or more and 50% by mole or less based on a total of the cis-form and the trans-form.

[20] The polyester resin composition for a reflective material according to any one of [16] to [19], wherein the alicyclic dicarboxylic acid component unit (h1) contains 30 to 100% by mole of a cyclohexanedicarboxylic acid component unit (h1-1) and 0 to 70% by mole of an alicyclic dicarboxylic acid component unit (h1-2) exclusive of the cyclohexanedicarboxylic acid component unit, a total of the cyclohexanedicarboxylic acid component unit (h1-1) and the alicyclic dicarboxylic acid component unit (h1-2) being 100% by mole, and the aliphatic diol component unit (h2) contains 30% by mole to 100% by mole of a cyclohexanedimethanol component unit (h2-1) and 0 to 70% by mole of an aliphatic diol component unit (h2-2) exclusive of the cyclohexanedimethanol component unit, a total of the cyclohexanedimethanol component unit (h2-1) and the aliphatic diol component unit (h2-2) being 100% by mole.

[21] The polyester resin composition for a reflective material according to [20], wherein the alicyclic dicarboxylic acid component unit (h1) contains a 1,4-cyclohexanedicarboxylic acid component unit derived from 1,4-cyclohexanedicarboxylic acid, and the aliphatic diol component unit (h2) contains a 1,4-cyclohexanedimethanol component unit derived from 1,4-cyclohexanedimethanol.

[22] The polyester resin composition for a reflective material according to any one of [16] to [21], wherein the polyester resin (H) has no melting point (Tm) as measured by a differential scanning calorimeter in accordance with JIS-K7121.

[23] The polyester resin composition for a reflective material according to any one of [16] to [22], wherein the polyester resin (G) contains: a dicarboxylic acid component unit (g1) containing 30 to 100% by mole of a dicarboxylic acid component unit (g1-1) derived from terephthalic acid and 0 to 70% by mole of an aromatic dicarboxylic acid component unit (g1-2) exclusive of terephthalic acid; and a diol component unit (g2) containing a $C_4$-$C_{20}$ alicyclic diol component unit (g2-1) and/or an aliphatic diol component unit (g2-2).

[24] The polyester resin composition for a reflective material according to [23], wherein the alicyclic diol component unit (g2-1) has a cyclohexane skeleton.

[25] The polyester resin composition for a reflective material according to [23], wherein the diol component unit (g2) contains 30 to 100% by mole of a cyclohexanedimethanol component unit (g2-1') and 0 to 70% by mole of the aliphatic diol component unit (g2-2).

[26] A reflective material comprising the polyester resin composition for a reflective material according to any one of [16] to [25].

[27] The reflective material according to [26], which is a reflective material for a light-emitting diode element.

Advantageous Effects of Invention

The polyester resin composition for a reflective material of the present invention enables to obtain a reflective material having high reflectance. In addition, the polyester resin composition for a reflective material of the present invention enables to obtain a reflective material having very high heat resistance and light resistance as well as high reflectance.

BRIEF DESCRIPTION OF DRAWING

FIG. 1 is a graph showing a relation between the proportion of a polyester resin (H) contained in a polyester resin composition for a reflective material and reflectance (initial reflectance and reflectance after 500 h UV irradiation).

DESCRIPTION OF EMBODIMENTS

The polyester resin composition for a reflective material of the present invention relates to two types of resin compositions, and reflective materials containing the resin compositions. They will now be described separately.

A. First Aspect

A-1. Polyester Resin Composition for Reflective Material

A polyester resin composition for a reflective material of the first aspect contains a polyester resin (A) and a white pigment (B), and as necessary, contains a glass fiber (C), an additive (D), a peroxide (E), a crosslinking auxiliary agent (F), and the like. The polyester resin composition for a reflective material of the present invention is excellent in fluidity and moldability, and a reflective material obtained by molding the polyester resin composition for a reflective material has high light reflectance.

A-1-1. Polyester Resin (A)

The polyester resin (A) typically contains a dicarboxylic acid component unit (a) derived from a dicarboxylic acid and a diol component unit (b) derived from a diol; and, in the present aspect, at least contains an alicyclic dicarboxylic acid component unit (a1) derived from an alicyclic dicarboxylic acid and an aliphatic diol component unit (b1) derived from an aliphatic diol.

(Dicarboxylic Acid Component Unit (a))

The dicarboxylic acid component unit (a) at least contains an alicyclic dicarboxylic acid component unit (a1). The amount of the alicyclic dicarboxylic acid component unit (a1) is 50% by mole or more, preferably 60% by mole or more, and even more preferably 70% by mole or more based on the amount (amount by mole) of the total dicarboxylic acid component unit (a). When the amount of the alicyclic dicarboxylic acid component unit (a1) is 50% by mole or more, a reflective material to be obtained tends to have high light resistance and toughness.

The alicyclic dicarboxylic acid component unit (a1) contains cis-trans isomers in cis-form and trans-form. The proportion (by mole) of the cis-form in the alicyclic dicarboxylic acid component unit is 20% by mole or more, preferably 35% by mole or more, and more preferably 50% by mole or more to the total amount of the alicyclic dicarboxylic acid component unit (a1). The proportion of the cis-form is measured by NMR (Nuclear Magnetic Resonance). When the proportion of the cis-form is 20% by mole or more, a reflective material to be obtained tends to have high reflectance.

Conventional polyester resins containing an alicyclic dicarboxylic acid component unit have a high proportion of the trans-form in the alicyclic dicarboxylic acid component unit. When the proportion of the trans-form in the alicyclic dicarboxylic acid component unit is large, however, the reflectance of a reflective material is not sufficiently enhanced. The reason is as follows: when a polyester resin and a white pigment are melt-kneaded and molded into a reflective material, the white pigment is homogeneously dispersed; meanwhile, the polyester resin crystallizes when the temperature of the molded product is lowered in the case that the proportion of the trans-form in the alicyclic dicarboxylic acid component unit in the polyester resin is large; since it is difficult for the white pigment to enter into the crystalline domains of the polyester resin, a large proportion of the trans-form in the alicyclic dicarboxylic acid component unit lowers the dispersibility of the white pigment in a reflective material to be obtained, and the reflectance of a reflective material tends to be lowered.

In contrast, when the proportion of the cis-form in the alicyclic dicarboxylic acid component unit in a polyester resin is large as in the present aspect, the polyester resin tends to become amorphous when being molded into a reflective material. In addition, the amorphous state tends to be maintained even when the temperature of the molded product is lowered. Therefore, the dispersibility of the white pigment is likely to be maintained, allowing a reflective material to be obtained to have high reflectance.

Here, the alicyclic dicarboxylic acid component unit (a1) preferably contains 30 to 100% by mole of a cyclohexanedicarboxylic acid component unit (a1-1) and 0 to 70% by mole of an alicyclic dicarboxylic acid component unit (a1-2) exclusive of the cyclohexanedicarboxylic acid. The total of the cyclohexanedicarboxylic acid component unit (a1-1) and the alicyclic dicarboxylic acid component unit (a1-2) is 100% by mole. The amount of the cyclohexanedicarboxylic acid component unit (a1-1) contained in the alicyclic dicarboxylic acid component unit (a1) is more preferably 50 to 100% by mole, and even more preferably 70 to 100% by mole. Cyclohexanedicarboxylic acids are easily available, and when the amount of the cyclohexanedicarboxylic acid component unit (a1-1) contained in the alicyclic dicarboxylic acid component unit (a1) is 30% by mole or more, it is not required to excessively raise the temperature in polymerizing the polyester resin (A), and temperature management during polymerizing is facilitated.

The cyclohexanedicarboxylic acid component unit (a1-1) is a structural unit derived from a cyclohexanedicarboxylic acid. The cyclohexanedicarboxylic acid may be any of 1,2-cyclohexanedicarboxylic acid, 1,3-cyclohexanedicarboxylic acid, and 1,4-cyclohexanedicarboxylic acid. The polyester resin (A) may contain either only one of structural units derived from them or two or more thereof. Among them, a structural unit derived from 1,4-cyclohexanedicarboxylic acid is particularly preferred from the viewpoint of easy polymerization, and the heat resistance, strength, rigidity, and the like of a reflective material to be obtained.

The cyclohexanedicarboxylic acid component unit (a1-1) may have a substituent. Examples of the substituent include $C_1$-$C_6$ alkyl groups, and the substituent may be, for example, a methyl group, an ethyl group, an n-propyl group, an isopropyl group, an n-butyl group, a tert-butyl group, or an n-hexyl group.

The alicyclic dicarboxylic acid component unit (a1-2) exclusive of the cyclohexanedicarboxylic acid is a structural unit derived from an alicyclic dicarboxylic acid (but exclusive of cyclohexanedicarboxylic acids). The alicyclic dicarboxylic acid is not particularly limited as long as the alicyclic dicarboxylic acid is a compound which has a saturated or unsaturated (with no aromaticity) alicyclic hydrocarbon skeleton and two carboxylic acids bonded to the skeleton. The number of carbon atoms of the alicyclic hydrocarbon skeleton is preferably 3 to 14, and more preferably 5 to 14. Examples of the alicyclic dicarboxylic acid include 1,3-cyclopentane dicarboxylic acid, 1,4-decahydronaphthalene dicarboxylic acid, 2,6-decahydronaphthalene dicarboxylic acid, 9,10-tetradecahydroanthracene dicarboxylic acid, and 1,3-adamantane dicarboxylic acid. The polyester resin (A) may contain either only one of structural units derived from them or two or more thereof.

The alicyclic dicarboxylic acid component unit (a1-2) may have a substituent. Examples of the substituent include $C_1$-$C_4$ alkyl groups, and the substituent may be, for example, a methyl group, an ethyl group, an n-propyl group, an isopropyl group, and a tert-butyl group.

Here, the dicarboxylic acid component unit (a) may contain a structural unit exclusive of the alicyclic carboxylic acid component unit (a1). Specifically, the dicarboxylic acid component unit (a) may contain a unit derived from an aromatic dicarboxylic acid, or a structural unit derived from an aliphatic dicarboxylic acid (but exclusive of alicyclic dicarboxylic acids). Examples of the aromatic dicarboxylic acid include terephthalic acid, isophthalic acid, 2-methylterephthalic acid, and naphthalenedicarboxylic acid. Examples of the aliphatic dicarboxylic acid include aliphatic dicarboxylic acids preferably having 4 to 20, more preferably having 6 to 12 carbon atoms. Specific examples thereof include adipic acid, suberic acid, azelaic acid, sebacic acid, decane dicarboxylic acid, undecane dicarboxylic acid, and dodecane dicarboxylic acid. The polyester resin (A) may contain either only one of structural units derived from them or two or more thereof.

The polyester resin (A) may contain a polyvalent carboxylic acid component unit in addition to the above dicarboxylic acid component unit (a). The polyvalent carboxylic acid component unit is, for example, a structural unit derived from a tribasic acid or a polybasic acid, such as trimellitic acid and pyromellitic acid.

(Diol Component Unit)

The diol component unit (b) at least contains an aliphatic diol component unit (b1). Here, the aliphatic diol encompasses not only acyclic diols but also cyclic diols, i.e., alicyclic diols. The amount of the aliphatic diol component unit (b1) is 50% by mole or more, preferably 60% by mole or more, and even more preferably 70% by mole or more based on the amount (amount by mole) of the total diol component unit (b). When the amount of the aliphatic diol component unit (b1) is 50% by mole or more, a reflective material to be obtained tends to have high light resistance, toughness, and the like.

The aliphatic diol component unit (b1) preferably contains an alicyclic diol component unit (b1') derived from an alicyclic diol such as a cyclohexanedimethanol, which will be described later. The alicyclic diol component unit (b1') contains cis-trans isomers in cis-form and trans-form. The proportion (by mole) of the cis-form of the alicyclic diol component unit (b1') is preferably 20 to 50% by mole and more preferably 20 to 40% by mole to the total amount of the alicyclic diol component unit (b1'). The proportion of the cis-form is measured by NMR (Nuclear Magnetic Resonance). When the proportion of the cis-form is 20% by mole or more, a reflective material obtained from the polyester resin composition for a reflective material tends to have high reflectance.

The aliphatic diol component unit (b1) preferably contains 30 to 100% by mole of a cyclohexanedimethanol component unit (b1-1) and 0 to 70% by mole of an aliphatic diol component unit (b1-2) exclusive of the cyclohexanedimethanol. The total of the cyclohexanedimethanol component unit (b1-1) and the aliphatic diol component unit (b1-2) is 100% by mole. The amount of the cyclohexanedimethanol component unit (b1-1) contained in the aliphatic diol component unit (b1) is more preferably 50 to 100% by mole and even more preferably 70 to 100% by mole. Cyclohexanedimethanols are easily available, and when the aliphatic diol component unit (b1) contains the cyclohexanedimethanol component unit (b1-1) in an amount of 30% by mole or more, it is not required to excessively raise the temperature in polymerizing the polyester resin (A), and temperature management during polymerizing is facilitated.

The cyclohexanedimethanol component unit (b1-1) is a structural unit derived from a cyclohexanedimethanol. The cyclohexanedimethanol may be any of 1,2-cyclohexanedimethanol, 1,3-cyclohexanedimethanol, and 1,4-cyclohexanedimethanol, but is preferably 1,4-cyclohexanedimethanol. The polyester resin (A) may contain either only one of structural units derived from them or two or more thereof. Among them, a structural unit derived from 1,4-cyclohexanedimethanol is particularly preferred from the viewpoint of easy polymerization, and the heat resistance, strength, rigidity, and the like of a reflective material to be obtained.

The cyclohexanedimethanol component unit (b1-1) may have a substituent. Examples of the substituent include $C_1$-$C_6$ alkyl groups, and the substituent may be, for example, a methyl group, an ethyl group, an n-propyl group, an isopropyl group, an n-butyl group, a tert-butyl group, or an n-hexyl group.

The aliphatic diol component unit (b1-2) exclusive of the cyclohexanedimethanol is a structural unit derived from an aliphatic diol (but exclusive of cyclohexanedimethanols). The aliphatic diol is not particularly limited as long as the aliphatic diol is a compound which has a saturated or unsaturated and acyclic or cyclic (with no aromaticity) hydrocarbon skeleton and two hydroxyl groups bonded to the alicyclic hydrocarbon skeleton. The number of carbon atoms of the hydrocarbon skeleton is preferably 4 to 20, and more preferably 5 to 16. Examples of the aliphatic diol include alicyclic diols such as 1,3-cyclopentanediol, 1,4-cyclohexanedimethanol, 1,4-cycloheptanediol, 1,4-cycloheptanedimethanol, (decahydronaphthalene-1,4-diyl)dimethanol, (decahydronaphthalene-2,6-diyl)dimethanol, (tetradecahydroanthracene-9,10-diyl)dimethanol, 1,3-adamantanediol, and 1,3-adamantanedimethanol; and acyclic aliphatic diols such as ethylene glycol, trimethylene glycol, propylene glycol, tetramethylene glycol, neopentyl glycol, hexamethylene glycol, and dodecamethylene glycol. The polyester resin (A) may contain either only one of structural units derived from them or two or more thereof.

The aliphatic diol component unit (b1-2) may have a substituent. Examples of the substituent include $C_1$-$C_6$ alkyl groups, and the substituent may be, for example, a methyl group, an ethyl group, an n-propyl group, an isopropyl group, an n-butyl group, a tert-butyl group, or an n-hexyl group.

The diol component unit (b) may contain a structural unit derived from a diol exclusive of the aliphatic diol component unit (b1), specifically, a structural unit derived from an aromatic diol. Examples of the aromatic diol include bisphenol, hydroquinone, and 2,2-bis(4-β-hydroxyethoxyphenyl)propanes. The polyester resin (A) may contain either only one of structural units derived from them or two or more thereof.

(Physical Properties of Polyester Resin (A))

The polyester resin (A) preferably has substantially no melting point (Tm) as measured by a differential scanning calorimeter in accordance with JIS-K7121. That is, the polyester resin (A) is preferably amorphous. When the polyester resin (A) is amorphous, a reflective material obtained by molding the resin composition tends to have high light reflectance, as described above.

On the other hand, the glass transition temperature (Tg) measured by a differential scanning calorimeter is preferably 40° C. or higher, and more preferably 45° C. or higher. When the glass transition temperature is in the range, a reflective material obtained from the resin composition tends to have high heat resistance. The glass transition temperature (Tg) of the resin contained in a reflective material may be lower than 40° C.; however, it is preferred in this case to raise the glass transition temperature (Tg) of the resin by, for example, crosslinking the polyester resin (A). The method for raising the glass transition temperature (Tg) of the resin may be, for example, a method of crosslinking with a crosslinking agent having functional groups reactive with an alcohol at molecular ends of the polyester resin (A) (e.g., an epoxy group), or a crosslinking agent having functional groups reactive with a carboxylic acid at molecular ends of the polyester resin (A) (e.g., an oxazoline group, an epoxy group, a carbodiimide group, and an isocyanate group); or alternatively, may be a method in which radicals are generated by using, for example, a peroxide (a peroxide (E), which will be described later) or an electron beam to crosslink through radicalization of C—H bonds in the main chains of the polyester resin. In particular, a peroxide (E) or crosslinking auxiliary agent (F), which will be described later, used in crosslinking causes crosslinking between the main chains of the polyester resin and the crosslinking density is likely to increase, and thus a reflective material to be obtained tends to have high mechanical strength and heat resistance. In addition, the long-term stability of a reflective material tends to be enhanced.

The intrinsic viscosity [η] of the polyester resin (A) is preferably 0.05 to 10 dl/g, more preferably 0.05 to 5 dl/g, and even more preferably 0.1 to 2.0 dl/g. When the intrinsic viscosity is in such a range, the flowability of the polyester resin composition for a reflective material during molding is excellent. The intrinsic viscosity of the polyester resin (A) may be adjusted, for example, on the basis of the molecular weight of the polyester resin (A). The method for adjusting the molecular weight of the polyester resin may be a known method such as adjusting the degree of progress in a polycondensation reaction or adding a suitable amount of a monofunctional carboxylic acid, a monofunctional alcohol, or the like.

The above-mentioned intrinsic viscosity is a value obtained by dissolving the polyester resin (A) in a 50 mass %/50 mass % mixed solvent of phenol and tetrachloroethane to obtain a sample solution, measuring the falling time (seconds) of the sample solution using an Ubbelohde viscometer under a condition of 25° C.±0.05° C., and calculating the intrinsic viscosity from the following equations:

$$[\eta]=\eta SP/[C(1+k\eta SP)]$$

[η]: intrinsic viscosity (dl/g)
ηSP: specific viscosity
C: sample concentration (g/dl)
t: falling time (seconds) of sample solution
t0: falling time (seconds) of a solvent
k: constant (slope determined by plotting solution concentration on the ordinate and ηSP/C on the abscissa, after measuring the specific viscosity of (3 or more) samples having different solution concentrations)

$$\eta SP=(t-t0)/t0$$

The polyester resin composition for a reflective material of the present aspect may contain a plurality of polyester resins (A) having different physical properties, as necessary.

(Method of Preparing Polyester Resin (A))

The method of preparing the polyester resin (A) is not particularly limited, and may be a known method of preparing a polyester resin. For example, the method may be a method in which a molecular weight modifier, or the like is blended into a reaction system to allow a dicarboxylic acid and a diol to undergo an esterification reaction; and then, the esterified product is subjected to a condensation reaction until a desired intrinsic viscosity (molecular weight) is reached.

Here, the proportion of the cis-form contained in the above-described alicyclic dicarboxylic acid component unit (a1) highly depends on the ratio between the cis-form and the trans-form of an alicyclic dicarboxylic acid as the raw material. Thus, it is preferred to set the amount (by mole) of the cis-form alicyclic dicarboxylic acid contained in the alicyclic dicarboxylic acid as the raw material to be 20% by mole or more based on the amount (by mole) of all the alicyclic dicarboxylic acids in order to set the amount of the cis-form contained in the alicyclic dicarboxylic acid component unit (a1) to be 20% by mole or more.

Similarly, the proportion of the cis-form contained in the alicyclic diol component unit (b1') is highly depends on the ratio between the cis-form and the trans-form of an alicyclic diol as the raw material. Thus, it is preferred to set the amount (by mole) of the cis-form alicyclic diol contained in the alicyclic diol as the raw material to be 20% by mole or more based on the amount (by mole) of all the alicyclic diols in order to set the amount of the cis-form contained in the alicyclic diol component unit (b1') to be 20% by mole or more.

Here, the intrinsic viscosity of the polyester resin (A) is adjusted by blending a molecular weight modifier into a reaction system in preparing the polyester resin (A). Examples of the molecular weight modifier include monocarboxylic acids and monoalcohols. Examples of the monocarboxylic acid include a $C_2$-$C_{30}$ aliphatic monocarboxylic acid, an aromatic monocarboxylic acid and an alicyclic monocarboxylic acid. It is noted that the aromatic monocarboxylic acid and the alicyclic monocarboxylic acid may have a substituent in the cyclic structure thereof. Examples of the aliphatic monocarboxylic acid include acetic acid, propionic acid, butyric acid, valeric acid, caproic acid, caprylic acid, lauric acid, tridecyl acid, myristic acid, palmitic acid, stearic acid, oleic acid, and linoleic acid. Further, examples of the aromatic monocarboxylic acid include benzoic acid, toluic acid, naphthalene carboxylic acid, methylnaphthalene carboxylic acid, and phenylacetic acid, and examples of the alicyclic monocarboxylic acid include cyclohexane carboxylic acid.

Such a molecular weight modifier is added preferably in an amount of 0.07 mol or less, and more preferably in an amount of 0.05 mol or less per 1 mol of the total amount of the dicarboxylic acid in the reaction system for the reaction between the dicarboxylic acid and the diol as described above.

A-1-2. White Pigment (B)

The white pigment (B) contained in the polyester resin composition for a reflective material of the present aspect is not particularly limited as long as the white pigment can whiten the resin composition to enhance a light-reflective function to be obtained by molding the resin composition. Specific examples of the white pigment (B) include titanium oxide, zinc oxide, zinc sulfide, lead white, zinc sulfate, barium sulfate, calcium carbonate, and alumina oxide. The polyester resin composition for a reflective material may contain either only one of these white pigments or two or more thereof. In addition, these white pigments may be treated with a silane coupling agent, titanium coupling agent, or the like. For example, the white pigment may be surface-treated with a silane compound such as vinyltriethoxysilane, 2-aminopropyltriethoxysilane, and 2-glycidoxypropyltriethoxysilane.

The white pigment (B) is particularly preferably titanium oxide. When the polyester resin composition for a reflective material contains titanium oxide, optical properties such as the reflectance and the concealability of a reflective material to be obtained are enhanced. The titanium oxide is preferably a rutile-type titanium oxide. The average particle diameter of the titanium oxide is preferably 0.1 to 0.5 μm, and more preferably 0.15 to 0.3 μm. The average particle diameter is measured with an image analyzer (LUZEX IIIU) or the like on the basis of a transmission electron micrograph.

The white pigment (B) is preferably a white pigment having a small aspect ratio, i.e., having approximately spherical shape, for the purpose of, e.g., uniformizing the reflectance of a reflective material obtained by molding the resin composition.

A-1-3. Glass Fiber (C)

The polyester resin composition for a reflective material of the present aspect may contain a glass fiber (C). When the glass fiber (C) is contained, the strength, rigidity, toughness, and the like of a reflective material to be obtained are enhanced. In particular, the thinner the glass fiber (C) is, the more the mechanical properties (in particular thin wall flexural strength) of a reflective material to be obtained are enhanced. In addition, the shrinkage of a reflective material is suppressed.

The average length of the glass fiber (C) contained in the polyester resin composition for a reflective material is preferably 1 μm to 20 mm, more preferably 5 μm to 10 mm, and even more preferably 10 μm to 5 mm from the viewpoint of retaining a satisfactory moldability and enhancing the mechanical properties and heat resistance of a molded article to be obtained. In addition, the aspect ratio of the glass fiber (C) is preferably 5 to 2,000, and more preferably 30 to 600.

The aspect ratio of the fiber cross-section of the glass fiber (C) is measured as follows: a resin component is removed from the polyester resin composition for a reflective material containing the glass fiber (C) or from the molded article containing the glass fiber (C) either by dissolving the resin component with a solvent, or by calcination of the composition or the molded article, to thereby separate the glass fiber (C); and the major axis and the minor axis of the separated glass fiber (C) are measured using an optical microscope or an electron microscope to calculate the aspect ratio.

The glass fiber (C) may be treated with a silane coupling agent, a titanium coupling agent, or the like. For example, the glass fiber (C) may be surface-treated with a silane compound such as vinyltriethoxysilane, 2-aminopropyltriethoxysilane, and 2-glycidoxypropyltriethoxysilane.

The glass fiber (C) may be coated with a sizing agent. Examples of the preferred sizing agent include acrylic, acrylic/maleic-modified, epoxy, urethane, urethane/maleic-modified, and urethane/epoxy-modified compounds. The glass fiber (C) may be coated with only one of these sizing agents or two or more thereof in combination.

Further, the glass fiber (C) may be treated with both a surface treating agent and a sizing agent. The combined use of the surface treating agent and the sizing agent increases the bonding between the glass fiber (C) and the polyester resin (A) and the like, and as a result a reflective material to be obtained tends to have satisfactory appearance and high strength.

The glass fiber (C) is preferably dispersed uniformly in the polyester resin composition for a reflective material, and is also preferably dispersed uniformly in the reflective material which is a molded article. The uniform dispersion of the glass fiber (C) in the polyester resin composition for a reflective material increases granularity, thus enhancing the mechanical properties of the molded article as well.

A-1-4. Additive (D)

The polyester resin composition for a reflective material of the present aspect may contain an arbitrary additive (D) as long as the effect of the present invention is not impaired. Examples of the additive (D) include antioxidants (such as phenols, amines, sulfur, and phosphorus); heat-resistant stabilizers (such as lactone compounds, vitamin E, hydroquinones, copper halides, and iodine compounds); light stabilizers (such as benzotriazoles, triazines, benzophenones, benzoates, hindered amines, and oxanilides); other polymers (such as polyolefins, ethylene-propylene copolymers, olefin copolymers such as an ethylene. 1-butene copolymer, olefin copolymers such as a propylene. 1-butene copolymer, polystyrenes, polyamides, polycarbonates, polyacetals, polysulfones, polyphenylene oxides, fluororesins, silicone resins, and LCP); flame retardants (such as bromine-based, chlorine-based, phosphorus-based, antimony-based, and inorganic flame retardants); fluorescent brightening agents; plasticizers; thickeners; antistatic agents; release agents; pigments; crystal nucleating agents; and various known compounding agents.

The polyester resin composition for a reflective material of the present aspect may contain a phosphorus-containing antioxidant. The phosphorus-containing antioxidant is preferably an antioxidant having a $P(OR)_3$ structure. Here, R is an alkyl group, alkylene group, aryl group, arylene group, or the like, and three Rs may be the same or different, or two Rs may form a cyclic structure. Examples of the phosphorus-containing antioxidant include triphenyl phosphite, diphenyl decyl phosphite, phenyl diisodecyl phosphite, tri (nonylphenyl) phosphite, bis(2,4-di-t-butylphenyl) pentaerythritol diphosphite, and bis(2,6-di-t-butyl-4-methylphenyl) pentaerythritol diphosphite. When the phosphorus-containing antioxidant is contained in the resin composition, the decomposition reaction of the polyester resin (A) is suppressed in a high temperature atmosphere (in particular, under conditions exceeding 250° C. as in the reflow process). As a result, the discoloration of a reflective material obtained by molding the resin composition is suppressed, for example.

When the polyester resin composition for a reflective material of the present aspect is used in combination with other resin compositions or the like, it is preferred to select an additive which does not act on other components contained in the composition (e.g., a compound which cannot be a catalyst poison) as the additive (D).

A-1-5. Peroxide (E)

The polyester resin composition for a reflective material of the present aspect may contain a peroxide (E). When the polyester resin composition for a reflective material contains the peroxide (E), the polyester resin (A) can be crosslinked through radicalization of C—H bonds in the main chains of the polyester resin (A), as described above. As a result, the heat resistance of a reflective material to be obtained is enhanced.

The polyester resin composition for a reflective material preferably contains the peroxide (E) together with a crosslinking auxiliary agent (F), which will be described later. The peroxide (E) is pyrolyzed to generate radicals, causing hydrogen-extracting reactions from the main chains of the polyester resin (A). However, the crosslinking efficiency of the polyester resin (A) is significantly lowered when the radicals generated bond together or the radicals react with a substance exclusive of the polyester resin (A). As a result, the polyester resin (A) is insufficiently crosslinked and the heat resistance of a reflective material to be obtained is less likely to be sufficiently enhanced. In contrast, when a crosslinking auxiliary agent (F), which will be described later, is contained, the radicals generated react with the crosslinking auxiliary agent (F) to be stabilized before the rebonding of the radicals generated, resulting in a stable crosslinking reaction of the polyester resin (A).

Here, the peroxide (E) may be a known organic peroxide. Examples of the peroxide (E) include diacyl peroxides, alkyl peroxyesters, peroxydicarbonates, peroxycarbonates, peroxyketals, dialkyl peroxides, hydroperoxides, and ketone peroxides. The temperature at which the half-life of such a peroxide (E) due to pyrolysis is 1 minute is preferably 100° C. or higher. When the temperature is 100° C. or higher, the stability of the composition tends to be enhanced.

More specific examples of the peroxide (E) include dilauroyl peroxide, dibenzoyl peroxide, 1,1-di(t-butylperoxy)-2-methylcyclohexane, 1,1-di(t-hexylperoxy)cyclohexane, 1,1-di(t-butylperoxy)cyclohexane, bis(butylperoxy)trimethylcyclohexane, bis(butylperoxy)cyclododecane, butyl bis(butylperoxy)valerate, dicumyl peroxide, butyl peroxybenzoate, dibutyl peroxide, bis(butylperoxy)diisopropylbenzene, dimethyl di(butylperoxy)hexane, dimethyl di(butylperoxy)hexyne, butyl peroxycumene, 2,5-dimethyl-2,5-di(t-butylperoxy)hexane, 1,1-di(t-amylperoxy)cyclohexane, t-butyl peroxy 2-ethylhexyl carbonate, and di-t-butyl peroxide. Examples of the commercial product include Luperox LP, Luperox A, Luperox 531, Luperox 331, Luperox TBEC, Luperox 230, Luperox DCP, Luperox 101, and Luperox DI (all manufactured by ARKEMA Yoshitomi, Ltd., "Luperox" is a registered trademark); and Perhexa MC, Perhexa HC, and Perbutyl E (all manufactured by NOF Corporation, "Perhexa" and "Perbutyl" are each a registered trademark).

A-1-6. Crosslinking Auxiliary Agent (F)

The polyester resin composition for a reflective material of the present aspect may contain a crosslinking auxiliary agent (F) in combination with the peroxide (E), as described above. The crosslinking auxiliary agent (F) contained accelerates the crosslinking of the polyester resin (A).

The type of the crosslinking auxiliary agent (F) is not particularly limited. Examples of the crosslinking auxiliary agent include (meth)acrylate crosslinking auxiliary agents such as acrylates such as ester acrylates, epoxy acrylates, urethane acrylates, ether acrylates, melamine acrylates, alkyd acrylates, and silicone acrylates, and ethylene glycol dimethacrylates; polyfunctional monomer crosslinking auxiliary agents having at least two ethylenically-unsaturated bonds in one molecule such as triallyl cyanurate and triallyl isocyanurate; and polyfunctional epoxy crosslinking auxiliary agents. The polyester resin composition for a reflective material may contain one of these crosslinking auxiliary agents (F) or two or more thereof.

Examples of the commercial product of the crosslinking auxiliary agent (F) include DAISO DAP® (manufactured by DAISO CO., LTD.); TAIC® and TAIC®-WH60 (all manufactured by Nippon Kasei Chemical Co., Ltd.); and SR368, SR295, and DPHA (all manufactured by Sartomer Co.).

The crosslinking auxiliary agent (F) preferably contains no aromatic ring in the molecule from the viewpoint of light resistance, and more preferably is a compound containing at least one ethylenically-unsaturated bond in one molecule such as dipentaerythritol hexaacrylate. The crosslinking auxiliary agent (F) is particularly preferably a polyfunctional monomer crosslinking auxiliary agent; specifically, the crosslinking auxiliary agent (F) is preferably a polyfunctional monomer having at least two ethylenically-unsaturated bonds and a triazine skeleton in one molecule. Examples of such a compound include triallyl isocyanurate (TAIC® and TAIC-WH60, all manufactured by Nippon Kasei Chemical Co., Ltd.) and tris(2-hydroxyethyl)isocyanurate triacrylate (SR368, manufactured by Sartomer Co.). These crosslinking agents have a satisfactory compatibility with the polyester resin (A), and the crosslinking of the polyester resin (A) is likely to progress homogeneously. In addition, the heat resistance and light resistance of a reflective material to be obtained tend to be enhanced.

A-1-7. Inorganic Filler

The polyester resin composition for a reflective material of the present aspect may contain an inorganic filler exclusive of the glass fiber (C). The inorganic filler may be various inorganic compound of a shape having a high aspect ratio such as a fibrous, powdery, granular, tabular, needle-like, cloth-like, and mat-like shape.

The average length of the inorganic filler is preferably 10 µm to 10 mm, and more preferably 10 µm to 5 mm. The aspect ratio (aspect ratio=major axis/minor axis) of the inorganic filler is preferably 1 to 500, more preferably 5 to 200, and even more preferably 10 to 350 from the viewpoint of, for example, the strength of a reflective material obtained by molding the resin composition, lowering of the coefficient of linear thermal expansion, and the like. The method of measuring the average length and aspect ratio of the inorganic filler may be the same as the method of measuring the average length and aspect ratio of the glass fiber (C).

Specific examples of the inorganic filler include glass fibers exclusive of the above-described glass fiber (C), inorganic compounds having a carbonyl structure (e.g., the whisker of a carbonate such as calcium carbonate), hydrotalcite, titanates such as potassium titanate, wollastonite, and xonotlite. The polyester resin composition for a reflective material may contain only one of them or two or more thereof. When two or more of these inorganic fillers are combined, the dispersibility of the inorganic fillers to the polyester resin (A) may be enhanced. When the dispersibility of the inorganic filler is enhanced, the heat resistance, mechanical strength, or the like of a reflective material obtained from the resin composition is enhanced, and in addition the dispersibility of the white pigment (B) may be improved.

Examples of the inorganic filler having a large average length or aspect ratio include silicates such as wollastonite (calcium silicate), and titanates such as a potassium titanate whisker. Examples of the inorganic filler having a small average length or aspect ratio include inorganic fillers (BW) having a carbonyl group. Specifically, the inorganic filler may be, for example, a whisker of a carbonate such as calcium carbonate.

A-1-8. Composition of Polyester Resin Composition for Reflective Material

The polyester resin composition for a reflective material of the present aspect contains the polyester resin (A) preferably at a content of 20 to 80 mass %, more preferably at a content of 30 to 70 mass %, and even more preferably at a content of 40 to 60 mass % to the total amount (100 mass %) of the polyester resin composition for a reflective material. When the content of the polyester resin (A) is in the range, a polyester resin composition for a reflective material having a satisfactory moldability can be obtained.

The polyester resin composition for a reflective material contains the white pigment (B) preferably in an amount of 5 mass % or more and less than 50 mass %, more preferably in an amount of 10 mass % or more and less than 50 mass %, and even more preferably in an amount of 10 to 40 mass % to the total amount (100 mass %) of the polyester resin composition for a reflective material. When the amount of the white pigment (B) is 5 mass % or more, a reflective material to be obtained tends to have high reflectance. When the amount of the white pigment (B) is less than 50 mass %, the amount of the polyester resin (A) is relatively large and the moldability of the resin composition becomes satisfactory.

In the case that the polyester resin composition for a reflective material contains the glass fiber (C), the glass fiber (C) is contained preferably in an amount of 10 to 50 mass %, more preferably in an amount of 10 to 40 mass %, and even more preferably in an amount of 10 to 30 mass % to the total amount (100 mass %) of the polyester resin composition for a reflective material. When the resin composition contains 10 mass % or more of the glass fiber (C), a molded product is not deformed even during injection molding or a soldering reflow process at a high temperature (for example, 250° C. to 280° C.), and the stability of reflectance over time tends to be enhanced. In addition, when the glass fiber (C) is contained in an amount of 50 mass % or less, it is possible to obtain a molded article having satisfactory moldability and appearance.

When the polyester resin composition for a reflective material contains the additive (D), the amount of the additive (D) to be added, which is appropriately selected depending on the type of the additive (D), is preferably 0 to 10 mass %, more preferably 0 to 5 mass %, and even more preferably 0 to 1 mass % in ratio relative to 100 mass % of the polyester resin (A).

When the polyester resin composition for a reflective material contains the peroxide (E), the amount of the peroxide (E) is preferably 0.1 to 30 parts by mass, and more preferably 0.1 to 10 parts by mass relative to 100 parts by mass of the above polyester resin (A). When the peroxide (E) in the range is contained in the polyester resin (A), the polyester resin (A) tends to be sufficiently crosslinked and a reflective material to be obtained tends to have high heat resistance.

When the polyester resin composition for a reflective material contains the crosslinking auxiliary agent (F), the amount of the crosslinking auxiliary agent (F) is preferably 0.1 to 50 parts by mass, and even more preferably 1 to 35 parts by mass relative to 100 parts by mass of the polyester resin (A). When the amount of the crosslinking auxiliary agent (F) is in the range, the polyester resin (A) tends to be sufficiently crosslinked.

A-2. Method of Producing Polyester Resin Composition for Reflective Material and Crosslinked Polyester Resin Composition for Reflective Material The polyester resin composition for a reflective material of the present aspect can be produced by a known method, for example, a method in which the above components are mixed with a Henschel mixer, a V-blender, a ribbon blender, a tumbler blender, or the like, or a method in which, after the mixing, the mixture is further melt-kneaded with a single-screw extruder, a multi-screw extruder, a kneader, a Banbury mixer, or the like and then granulated or ground.

In particular, when the polyester resin composition for a reflective material contains the peroxide (E) and the crosslinking auxiliary agent (F), a crosslinked polyester resin composition for a reflective material containing a crosslinked polyester resin (A'), which is crosslinked polyester resin (A), can be obtained by mixing the above components followed by melt-kneading.

The melt-kneading may be carried out in batch mode or continuous mode. The apparatus for melt-kneading may be any of an extruder, a Banbury mixer, a Brabender, a roller, a kneader, and the like. It is desired to mix the components homogeneously for homogeneous crosslinking.

The kneading temperature in crosslinking the polyester resin (A) is preferably in the range from "Tg of polyester resin (A)+30° C." to "temperature at which half-life of peroxide (E) due to decomposition is 1 minute—20° C.". The kneading time is preferably approximately 30 seconds to 20 minutes. When the kneading temperature is too low or the kneading time is too short, the kneading and reaction are likely to be insufficient and the heat resistance of a reflective material to be obtained is less likely to be enhanced sufficiently. On the other hand, when the kneading temperature is too high or the kneading time is too long, the polyester resin (A) is decomposed or colored, or the peroxide (E) is decomposed or reacts with other components.

In the case that all of the above-described components are solid, a dry blend of them prepared in advance may be fed into a kneading apparatus. Alternatively, the components may be fed into a kneading apparatus with, for example, a powder feeder. In the case that a liquid component is included in the above-described components, the liquid component may be fed into a melt-kneader separately after a mixture in which the polyester resin (A) and the white pigment (B) have been mixed and dispersed in advance together with the glass fiber (C) or the like, as necessary, is charged into the melt-kneader. In particular, dispersing the peroxide (E), the crosslinking auxiliary agent (F), and the like in a solvent or the like before charging into a melt-kneader facilitates to mix them with the polyester resin (A) and the like homogeneously.

The timing to mix the peroxide (E) or the crosslinking auxiliary agent (F) is not particularly limited, and the mixing may be carried out at the same time as feeding the polyester resin (A) and the white pigment (B) into a kneading apparatus, or the peroxide (E) or the crosslinking auxiliary agent (F) may be charged during kneading the polyester resin (A) and the white pigment (B).

A-3. Application of Polyester Resin Composition for Reflective Material and Crosslinked Polyester Resin Composition for Reflective Material The reflective material of the present aspect is a molded product obtained by molding the above-described polyester resin composition for a reflective material or crosslinked polyester resin composition for a reflective material into an arbitrary shape. The light reflectance of the reflective material is appropriately selected depending on, for example, the proportions of the polyester resin (A) and the white pigment (B), and the light reflectance at a wave length of 450 nm is preferably 80% or higher, more preferably 94% or higher, and even more preferably 95% or higher. When the light reflectance is 85% or higher, the reflective material can be applied to various products for which a high luminance is required. The reflectance is measured using a spectrocolorimeter.

The reflective material of the present aspect has high mechanical strength, very high reflectance, and less lowering of reflectance over time, and thus is suitable as reflective materials for various applications. The reflective material is particularly suitable as a reflective material to reflect a beam from a light source such as a semiconductor laser and a light-emitting diode. In particular, the crosslinked polyester resin composition for a reflective material is excellent also in heat resistance. Therefore, the crosslinked polyester resin composition for a reflective material remains very stable even after being subjected to heat or the like from a light source.

Here, the reflective materials typically include a casing or housing whose surface is open or not open, in which the surface is at least in the light-emitted direction. More specifically, the reflective materials also include three-dimensional molded articles generally having a light-reflecting surface (a surface such as a planar surface, a spherical surface, and a curved surface), such as molded articles including a box-like or case-like molded article, a funnel-like molded article, a bowl-like molded article, a parabolic molded article, a cylindrical molded article, a conical molded article, and a honeycomb molded article.

Since the reflective material obtained by using the polyester resin composition for a reflective material of the present aspect is excellent in heat resistance, the stability of reflectance over time, and further in toughness, even a thin reflective material is considered to have high possibility of having sufficient strength. Therefore, the reflective material is expected to contribute to the weight reduction and miniaturization of an LED device, or the like.

The most preferable application of the reflective material of the present aspect is as a reflective material for a light-emitting diode element. The reflective material for the light-emitting diode (LED) element of the present aspect is obtained by shaping the polyester resin composition for a reflective material into a desired shape by hot forming such as injection molding, particularly insert molding of metal such as hoop molding, melt molding, extrusion molding, inflation molding, and blow molding. In addition, a light-emitting diode device can be obtained by mounting an LED element and other parts to the reflective material, followed by sealing, joining or bonding with a sealing resin, or the like.

Further, the polyester resin composition for a reflective material and the reflective material of the present aspect can be adapted not only to the LED application, but also to other applications for reflecting a beam. As specific examples, the reflective material of the present aspect can be used as a reflective material for light-emitting apparatuses, such as various electric electronic components, interior illumination, ceiling illumination, exterior illumination, automobile illumination, display equipment, and headlights.

B. Second Aspect

B-1. Polyester Resin Composition for Reflective Material

A polyester resin composition for a reflective material of the second aspect contains two types of polyester resins (G) and (H), a white pigment (J), and an inorganic filler (K).

As described above, conventional compositions for a reflective material has a problem of difficulty in obtaining a reflective material having light resistance, reflectivity, and heat resistance simultaneously. In contrast, the polyester resin composition for a reflective material of the present aspect contains a polyester resin (G) having a high glass transition temperature or melting point. Therefore, the heat resistance of a reflective material tends to be enhanced, and in addition the dimensional stability is enhanced. At the same time, the polyester resin for a reflective material of the present invention contains a polyester resin (H) containing an alicyclic dicarboxylic acid component unit (h1) and an aliphatic diol component unit (h2). As a result, the reflectivity of a reflective material tends to be enhanced, and in addition the reflectance is less likely to decrease even after irradiation with light for a long period. That is, the present aspect enables to obtain a reflective material having high reflectance over a long period.

B-1-1. Polyester Resin (G)

The polyester resin (G) refers to a polyester resin having a melting point (Tm) or glass transition temperature (Tg) of 250° C. or higher measured by a differential scanning calorimeter (DSC). The lower limit of the melting point (Tm) or glass transition temperature (Tg) of the polyester resin (G) is preferably 270° C. or higher, and more preferably 290° C. On the other hand, an example of a preferred upper limit of the melting point (Tm) or glass transition temperature (Tg) is 350° C., and is more preferably 335° C. When the melting point or glass transition temperature is 250° C. or higher, the deformation of the reflective material (molded article of resin composition) during reflow soldering is suppressed. While the upper limit temperature is not limited in principle, the melting point or glass transition temperature of 350° C. or lower is preferable because the decomposition of the polyester resin (H) and the like is suppressed during melt molding. That is, the melting point (Tm) or glass transition temperature (Tg) of the polyester resin (G) is preferably 270° C. to 350° C., and more preferably 290 to 335° C.

Here, the type of the polyester resin (G) is not particularly limited as long as the resin has the above melting point (Tm) or glass transition temperature (Tg) and containing in the main skeleton a polyester structure consisting of a dicarboxylic acid component unit (g1) and a diol component unit (g2). However, when the polyester resin (G) contains a component unit derived from an aromatic dicarboxylic acid and a component unit derived from a diol having a cyclic skeleton, a reflective material to be obtained tends to have high heat resistance, and in addition the moldability of the polyester resin composition for a reflective material tends to be enhanced.

(Dicarboxylic Acid Component Unit (G1))

As described above, the dicarboxylic acid component unit (g1) in the polyester resin (G) preferably contains a component unit derived from an aromatic dicarboxylic acid, and in particular, preferably contains 30 to 100% by mole of a terephthalic acid component unit (g1-1) and 0 to 70% by mole of an aromatic dicarboxylic acid component unit (g1-2) exclusive of terephthalic acid. The total amount of the dicarboxylic acid component units in the dicarboxylic acid component unit (g1) is 100% by mole. Examples of the aromatic dicarboxylic acid component unit (g1-2) exclusive of terephthalic acid include isophthalic acid, 2-methyl-terephthalic acid, and naphthalene dicarboxylic acids.

The amount of the terephthalic acid component unit (g1-1) is more preferably 40 to 100% by mole, and even more preferably 40 to 80% by mole to the total amount (amount by mole) of the dicarboxylic acid component unit (g1). The amount of the aromatic dicarboxylic acid component unit (g1-2) exclusive of terephthalic acid is more preferably 0 to 60% by mole, and even more preferably 20 to 60% by mole to the total amount (amount by mole) of the dicarboxylic acid component unit (g1).

The dicarboxylic acid component unit (g1) may further contain an aliphatic dicarboxylic acid component unit (g1-3) in an amount of 10% by mole or less to the total amount by mole of the dicarboxylic acid component unit (g1). The number of carbon atoms in the aliphatic chain contained in the aliphatic dicarboxylic acid component unit (g1-3) is not particularly limited, but is preferably 4 to 20, and more preferably 6 to 12. Examples of the aliphatic dicarboxylic acid used for deriving the aliphatic dicarboxylic acid component unit (g1-3) include adipic acid, suberic acid, azelaic acid, sebacic acid, decane dicarboxylic acid, undecane dicarboxylic acid, and dodecane dicarboxylic acid; and preferably adipic acid.

The dicarboxylic acid component unit (g1) may further contain a polyvalent carboxylic acid component unit (g1-4) in an amount of 10% by mole or less to the total amount by mole of the dicarboxylic acid component unit (g1). The polyvalent carboxylic acid component unit (g1-4) may be, for example, a tribasic acid or a polybasic acid, such as trimellitic acid and pyromellitic acid.

In addition, the dicarboxylic acid component unit (g1) may contain a component unit derived from an alicyclic dicarboxylic acid such as cyclohexanedicarboxylic acids, in a range that does not impair the effect of the present aspect.

(Diol Component Unit (g2))

As described above, the diol component unit (g2) in the polyester resin (G) preferably contains a diol component unit having a cyclic skeleton. The diol component unit derived from a diol having a cyclic skeleton may be a component unit derived from an alicyclic diol or a component unit derived from an aromatic diol, but is preferably a component unit (g2-1) derived from an alicyclic diol from the viewpoint of heat resistance and moldability.

The alicyclic diol component unit (g2-1) is preferably a component unit derived from a diol having a $C_4$-$C_{20}$ alicyclic hydrocarbon skeleton. Examples of the diol having an alicyclic hydrocarbon skeleton include alicyclic diols such as 1,3-cyclopentanediol, 1,3-cyclopentanedimethanol, 1,4-cyclohexanediol, 1,4-cyclohexanedimethanol, 1,4-cycloheptanediol, and 1,4-cycloheptanedimethanol. Among these compounds, from the viewpoint of heat resistance, water absorption properties, availability, and the like, the alicyclic diol component unit (g2-1) is preferably a component unit derived from a diol having a cyclohexane skeleton, and more preferably a component unit (g2-1') derived from a cyclohexanedimethanol.

The amount of the alicyclic diol component unit (g2-1) is preferably 50 to 100% by mole, and more preferably 60 to 100% by mole to the total amount (amount by mole) of the diol component unit (g2). When the amount of the alicyclic diol component unit (g2-1) is in the range, a reflective material obtained by molding the polyester resin composition for a reflective material tends to have high heat resistance.

While the alicyclic diol contains isomers having a cis/trans configuration or the like, the trans configuration is preferred from the viewpoint of heat resistance. Accordingly, the cis/trans ratio is preferably 50/50 to 0/100, and more preferably 40/60 to 0/100. The cis/trans ratio is measured in $^1$H-NMR measurement of the polyester resin (G) dissolved in deuterated chloroform:trifluoroacetic acid (volume ratio 4:1). The $^1$H-NMR measurement can be performed using, for example, an ECA-500 manufactured by JEOL Ltd. under a condition of 50° C. Data acquired is analyzed to determine the cis/trans ratio of the alicyclic diol component unit.

The diol component unit (g2) preferably contains an aliphatic diol component unit (g2-2) derived from an aliphatic diol, in addition to the alicyclic diol component unit (g2-1). When the diol component unit (g2) contains the aliphatic diol component unit (g2-2), the melt-flowability of the polyester resin composition for a reflective material is enhanced. Examples of the aliphatic diol include ethylene glycol, trimethylene glycol, propylene glycol, tetramethylene glycol, neopentyl glycol, hexamethylene glycol, and dodecamethylene glycol.

The amount of the aliphatic diol component unit (g2-2) is preferably 0 to 50% by mole, and more preferably 0 to 40% by mole to the total amount (amount by mole) of the diol component unit (g2). When the amount of the aliphatic diol component unit (g2-2) is in the range, the melt-flowability of the polyester resin composition for a reflective material is sufficiently enhanced.

The diol component unit (g2) may further contain an aromatic diol component unit (g2-3) as necessary, in addition to the alicyclic diol component unit (g2-1). Examples of the aromatic diol include aromatic diols such as bisphenol, hydroquinone, and 2,2-bis(4-β-hydroxyethoxyphenyl)propanes.

(Physical Properties of Polyester Resin (G))

The intrinsic viscosity [η] of the polyester resin (G) is preferably 0.3 to 1.0 dl/g. When the intrinsic viscosity is in such a range, the flowability of the polyester resin composition for a reflective material during molding is excellent. The intrinsic viscosity of the polyester resin (G) may be adjusted, for example, by adjusting the molecular weight of the polyester resin (G). For adjusting the molecular weight of the polyester resin, use can be made of a known method, such as adjusting the degree of progress in a polycondensation reaction or adding a suitable amount of a monofunctional carboxylic acid, a monofunctional alcohol, or the like.

The above-mentioned intrinsic viscosity is a value obtained by dissolving the polyester resin (G) in a 50 mass %/50 mass % mixed solvent of phenol and tetrachloroethane to obtain a sample solution, measuring the falling time (seconds) of the sample solution using an Ubbelohde viscometer under a condition of 25° C.±0.05° C., and calculating the intrinsic viscosity from the following equations:

$$[\eta] = \eta SP/[C(1+k\eta SP)]$$

[η]: intrinsic viscosity (dug)
ηSP: specific viscosity
C: sample concentration (g/dl)
t: falling time (seconds) of sample solution
t0: falling time (seconds) of a solvent
k: constant (slope determined by plotting solution concentration on the ordinate and ηSP/C on the abscissa, after measuring the specific viscosity of (3 or more) samples having different solution concentrations)

$\eta SP=(t-t0)/t0$

The polyester resin composition for a reflective material of the present aspect may contain a plurality of polyester resins (G) having different physical properties, as necessary.

(Method of Preparing Polyester Resin (G))

The polyester resin (G) is obtained, for example, by blending a molecular weight modifier, or the like into a reaction system to allow a dicarboxylic acid and a diol to react with each other. The intrinsic viscosity of the polyester resin (G) can be adjusted by blending the molecular weight modifier into the reaction system.

As the molecular weight modifier, a monocarboxylic acid or a monoalcohol can be used. Examples of the monocarboxylic acid include $C_2$-$C_{30}$ aliphatic monocarboxylic acids, $C_2$-$C_{30}$ aromatic monocarboxylic acids and $C_2$-$C_{30}$ alicyclic monocarboxylic acids. It is noted that the aromatic monocarboxylic acid and the alicyclic monocarboxylic acid may have a substituent in the cyclic structure thereof. Examples of the aliphatic monocarboxylic acid include acetic acid, propionic acid, butyric acid, valeric acid, caproic acid, caprylic acid, lauric acid, tridecyl acid, myristic acid, palmitic acid, stearic acid, oleic acid, and linoleic acid. Further, examples of the aromatic monocarboxylic acid include benzoic acid, toluic acid, naphthalene carboxylic acid, methylnaphthalene carboxylic acid, and phenylacetic acid, and examples of the alicyclic monocarboxylic acid include cyclohexane carboxylic acid.

Such a molecular weight modifier is used typically in an amount of 0 to 0.07 mol, and preferably in an amount of 0 to 0.05 mol per 1 mol of the total amount of the dicarboxylic acid in the reaction system for the reaction between the dicarboxylic acid and the diol as described above.

B-1-2. Polyester Resin (H)

The polyester resin (H) is a polyester resin at least containing an alicyclic dicarboxylic acid component unit (h1) derived from an alicyclic dicarboxylic acid and an aliphatic diol component unit (h2) derived from an aliphatic diol. It is noted that polyester resins corresponding to the polyester resin (G) are not included in the polyester resin (H) in the present aspect.

(Dicarboxylic Acid Component Unit)

As described above, the dicarboxylic acid component unit in the polyester resin (H) at least contains an alicyclic dicarboxylic acid component unit (h1). The amount of the alicyclic dicarboxylic acid component unit (h1) is 50% by mole or more, preferably 60% by mole or more, and more preferably 70% by mole or more to the total amount (amount by mole) of the dicarboxylic acid component unit. When the amount of the alicyclic dicarboxylic acid component unit (h1) is 50% by mole or more, a reflective material to be obtained tends to have high light resistance and toughness.

Here, the alicyclic dicarboxylic acid component unit (h1) contains the cis-form and the trans-form of the cis/trans isomers. The proportion (by mole) of the cis-form of the alicyclic dicarboxylic acid component unit is preferably 20% by mole or more, more preferably 35% by mole or more, and even more preferably 50% by mole or more to the total amount of the alicyclic dicarboxylic acid component unit (h1) (the total amount of the cis-form and the trans-form). The proportion of the cis-form contained in the alicyclic dicarboxylic acid component unit is measured by NMR (Nuclear Magnetic Resonance), and can be determined in the same manner as in determination of the cis/trans ratio of the alicyclic diol component unit in the polyester resin (G). When the proportion of the cis-form is 20% by mole or more, the polyester resin (H) is likely to become amorphous in molding a reflective material. In addition, the amorphous state is likely to be maintained even after the temperature of a molded product is lowered. Accordingly, the dispersibility of the white pigment is likely to be maintained and a reflective material to be obtained tends to have high reflectance.

More specifically, the alicyclic dicarboxylic acid component unit (h1) preferably contains 30 to 100% by mole of a cyclohexanedicarboxylic acid component unit (h1-1) and 0 to 70% by mole of an alicyclic dicarboxylic acid component unit (h1-2) exclusive of the cyclohexanedicarboxylic acid. The total of the cyclohexanedicarboxylic acid component unit (h1-1) and the alicyclic dicarboxylic acid component unit (h1-2) is 100% by mole. The amount of the cyclohexanedicarboxylic acid component unit (h1-1) contained in the alicyclic dicarboxylic acid component unit (h1) is more preferably 50 to 100% by mole, and even more preferably 70 to 100% by mole. Cyclohexanedicarboxylic acids are easily available, and when the amount of the cyclohexanedicarboxylic acid component unit (h1-1) contained in the alicyclic dicarboxylic acid component unit (h1) is 30% by mole or more, it is not required to excessively raise the temperature in polymerizing the polyester resin (H), and temperature management during polymerizing is facilitated.

The cyclohexanedicarboxylic acid component unit (h1-1) is a component unit derived from a cyclohexanedicarboxylic acid. The cyclohexanedicarboxylic acid may be any of 1,2-cyclohexanedicarboxylic acid, 1,3-cyclohexanedicarboxylic acid, and 1,4-cyclohexanedicarboxylic acid. The polyester resin (H) may contain either only one of structural units derived from them or two or more thereof. Among them, a component unit derived from 1,4-cyclohexanedicarboxylic acid is particularly preferred from the viewpoint of easy polymerization, and the heat resistance, strength, rigidity, and the like of a reflective material to be obtained.

The cyclohexanedicarboxylic acid component unit (h1-1) may have a substituent. Examples of the substituent include $C_1$-$C_6$ alkyl groups, and the substituent may be, for example, a methyl group, an ethyl group, an n-propyl group, an isopropyl group, an n-butyl group, a tert-butyl group, or an n-hexyl group.

The alicyclic dicarboxylic acid component unit (h1-2) exclusive of the cyclohexanedicarboxylic acid is a component unit derived from an alicyclic dicarboxylic acid (but exclusive of cyclohexanedicarboxylic acids). The alicyclic dicarboxylic acid is not particularly limited as long as the alicyclic dicarboxylic acid has a saturated or unsaturated (with no aromaticity) alicyclic hydrocarbon skeleton and in which two carboxylic acids bond to the skeleton. The number of carbon atoms of the alicyclic hydrocarbon skeleton is preferably 3 to 14, and more preferably 5 to 14. Examples of the alicyclic dicarboxylic acid include 1,3-cyclopentane dicarboxylic acid, 1,4-decahydronaphthalene dicarboxylic acid, 2,6-decahydronaphthalene dicarboxylic acid, 9,10-tetradecahydroanthracene dicarboxylic acid, and 1,3-adamantane dicarboxylic acid. The polyester resin (H) may contain either only one of component units derived from them or two or more thereof.

The alicyclic dicarboxylic acid component unit (h1-2) may have a substituent. Examples of the substituent include $C_1$-$C_4$ alkyl groups, and the substituent may be, for example, a methyl group, an ethyl group, an n-propyl group, an isopropyl group, and a tert-butyl group.

Here, the dicarboxylic acid component unit may contain a component unit exclusive of the alicyclic dicarboxylic acid component unit (h1). Specifically, the dicarboxylic acid component unit may contain a unit derived from an aromatic dicarboxylic acid, or a component unit derived from an aliphatic dicarboxylic acid (but exclusive of alicyclic dicarboxylic acids). Examples of the aromatic dicarboxylic acid include terephthalic acid, isophthalic acid, 2-methylterephthalic acid, and naphthalene dicarboxylic acid. Examples of the aliphatic dicarboxylic acid include aliphatic dicarboxylic acids preferably having 4 to 20 carbon atoms, more preferably having 6 to 12 carbon atoms. Specific examples thereof include adipic acid, suberic acid, azelaic acid, sebacic acid, decane dicarboxylic acid, undecane dicarboxylic acid, and dodecane dicarboxylic acid. The polyester resin (H) may contain either only one of component units derived from them or two or more thereof.

The polyester resin (H) may contain a polyvalent carboxylic acid unit in addition to the above dicarboxylic acid component unit. The polyvalent carboxylic acid unit may be, for example, a component unit derived from a tribasic acid or a polybasic acid, such as trimellitic acid and pyromellitic acid.

(Diol Component Unit)

The diol component unit in the polyester resin (H) at least contains an aliphatic diol component unit (h2), as described above. In the present aspect, the aliphatic diol encompasses not only acyclic diols but also cyclic diols, i.e., alicyclic diols. The amount of the aliphatic diol component unit (h2) is 50% by mole or more, preferably 60% by mole or more, and even more preferably 70% by mole or more to the total amount (amount by mole) of the diol component unit. When the amount of the aliphatic diol component unit (h2) is 50% by mole or more, a reflective material to be obtained tends to have high light resistance, toughness, and the like.

The aliphatic diol component unit (h2) preferably contains an alicyclic diol component unit (h2') derived from an alicyclic diol such as a cyclohexanedimethanol, which will be described later. Here, the alicyclic diol component unit (h2') contains cis/trans isomers in cis-form and trans-form. The proportion (by mole) of the cis-form of the alicyclic diol component unit (h2') is preferably 20 to 50% by mole and more preferably 20 to 40% by mole to the total amount of the alicyclic diol component unit (h2'). The proportion of the cis-form is measured by NMR (Nuclear Magnetic Resonance), and can be determined in the same manner in determination of the cis/trans ratio of the alicyclic diol component unit in the polyester resin (G). When the proportion of the cis-form is 20% by mole or more, a reflective material obtained from the polyester resin composition for a reflective material tends to have high reflectance.

More specifically, the aliphatic diol component unit (h2) preferably contains 30 to 100% by mole of a cyclohexanedimethanol component unit (h2-1) and 0 to 70% by mole of an aliphatic diol component unit (h2-2) exclusive of the cyclohexanedimethanol. The total of the cyclohexanedimethanol component unit (h2-1) and the aliphatic diol component unit (h2-2) is 100% by mole. The amount of the cyclohexanedimethanol component unit (h2-1) contained in the aliphatic diol component unit (h2) is more preferably 50 to 100% by mole, and even more preferably 70 to 100% by mole. Cyclohexanedimethanols are easily available, and when the aliphatic diol component unit (h2) contains the cyclohexanedimethanol component unit (h2-1) in an amount of 30% by mole or more, it is not required to excessively raise the temperature in polymerizing the polyester resin (H), and temperature management during polymerizing is facilitated.

The cyclohexanedimethanol component unit (h2-1) is a component unit derived from a cyclohexanedimethanol. The cyclohexanedimethanol may be any of 1,2-cyclohexanedimethanol, 1,3-cyclohexanedimethanol, and 1,4-cyclohexanedimethanol, but is preferably 1,4-cyclohexanedimethanol. The polyester resin (H) may contain either only one of component units derived from them or two or more thereof. Among them, a component unit derived from 1,4-cyclohexanedimethanol is particularly preferred from the viewpoint of easy polymerization, and the heat resistance, strength, rigidity, and the like of a reflective material to be obtained.

The cyclohexanedimethanol component unit (h2-1) may have a substituent. Examples of the substituent include $C_1$-$C_6$ alkyl groups, and the substituent may be, for example, a methyl group, an ethyl group, an n-propyl group, an isopropyl group, an n-butyl group, a tert-butyl group, or an n-hexyl group.

The aliphatic diol component unit (h2-2) exclusive of the cyclohexanedimethanol is a component unit derived from an aliphatic diol (but exclusive of cyclohexanedimethanols). The aliphatic diol is not particularly limited as long as the aliphatic diol has a saturated or unsaturated and acyclic or cyclic (with no aromaticity) hydrocarbon skeleton and in which two hydroxyl groups bond to the alicyclic hydrocarbon skeleton. The number of carbon atoms of the hydrocarbon skeleton is preferably 4 to 20, and more preferably 5 to 16. Examples of the aliphatic diol include alicyclic diols such as 1,3-cyclopentanediol, 1,4-cyclohexanedimethanol, 1,4-cycloheptanediol, 1,4-cycloheptanedimethanol, (decahydronaphthalene-1,4-diyl)dimethanol, (decahydronaphthalene-2,6-diyl)dimethanol, (tetradecahydroanthracene-9,10-diyl)dimethanol, 1,3-adamantanediol, and 1,3-adamantanedimethanol; and acyclic aliphatic diols such as ethylene glycol, trimethylene glycol, propylene glycol, tetramethylene glycol, neopentyl glycol, hexamethylene glycol, and dodecamethylene glycol. The polyester resin (H) may contain either only one of component units derived from them or two or more thereof.

The aliphatic diol component unit (h2-2) may have a substituent. Examples of the substituent include $C_1$-$C_6$ alkyl groups, and the substituent may be, for example, a methyl group, an ethyl group, an n-propyl group, an isopropyl group, an n-butyl group, a tert-butyl group, or an n-hexyl group.

The diol component unit may contain a component unit derived from a diol exclusive of the aliphatic diol component unit (h2), specifically, a component unit derived from an aromatic diol, in a range that does not impair the effect of the present aspect. Examples of the aromatic diol include bisphenol, hydroquinone, and 2,2-bis(4-β-hydroxyethoxyphenyl)propanes. The polyester resin (H) may contain either only one of component units derived from the aromatic diols or two or more thereof.

(Physical Properties of Polyester Resin (H))

The polyester resin (H) preferably has substantially no melting point (Tm) as measured by a differential scanning calorimeter in accordance with JIS-K7121. That is, the polyester resin (H) is preferably amorphous. When the polyester resin (H) is amorphous, a reflective material obtained by molding the polyester resin composition for a reflective material of the present aspect tends to have high light reflectance, as described above.

On the other hand, the glass transition temperature (Tg) measured by a differential scanning calorimeter is preferably 40° C. or higher, and more preferably 45° C. or higher. When the glass transition temperature is in the range, a reflective material obtained from the polyester resin composition for a reflective material tends to have high heat resistance. The glass transition temperature (Tg) of the polyester resin (H) can be raised by crosslinking the polyester resin (H). The method for raising the glass transition temperature (Tg) of the polyester resin (H) may be, for example, a method of crosslinking with a crosslinking agent having functional groups reactive with an alcohol at molecular ends of the polyester resin (H) (e.g., an epoxy group), or a crosslinking agent having functional groups reactive with a carboxylic acid at molecular ends of the polyester resin (H) (e.g., an oxazoline group, an epoxy group, a carbodiimide group, and an isocyanate group). Alternatively, crosslinking can be achieved by generating radicals by using, for example, a peroxide or an electron beam to radicalize C—H bonds in the main chain of the polyester resin. Then, crosslinking can also be accelerated by using a crosslinking auxiliary agent.

The intrinsic viscosity [η] of the polyester resin (H) is preferably 0.2 to 10 dl/g, more preferably 0.3 to 5 dl/g, and even more preferably 0.4 to 2.0 dl/g. When the intrinsic viscosity is in such a range, the flowability of the polyester resin composition for a reflective material during molding is excellent. The intrinsic viscosity of the polyester resin (H) may be adjusted, for example, on the basis of the molecular weight of the polyester resin (H). The method for adjusting the molecular weight of the polyester resin may be a known method such as adjusting the degree of progress in a polycondensation reaction or adding a suitable amount of a monofunctional carboxylic acid, a monofunctional alcohol, or the like. The method of measuring the intrinsic viscosity of the polyester resin (H) may be the same as the above-described method of measuring the intrinsic viscosity of the polyester resin (G).

The polyester resin composition for a reflective material of the present aspect may contain a plurality of polyester resins (H) having different physical properties, as necessary.

(Method of Preparing Polyester Resin (H))

The method of preparing the polyester resin (H) is not particularly limited, and may be the same as the above-described method of preparing the polyester resin (G). For example, the method may be a method in which a molecular weight modifier, or the like is blended into a reaction system to allow an alicyclic dicarboxylic acid and an aliphatic diol to undergo an esterification reaction; and then, the esterified product is subjected to a condensation reaction until a desired intrinsic viscosity (molecular weight) is reached.

Here, the proportion of the cis-form contained in the above-described alicyclic dicarboxylic acid component unit (h1) highly depends on the ratio between the cis-form and the trans-form of an alicyclic dicarboxylic acid as the raw material. Thus, it is preferred to set the amount (by mole) of the cis-form alicyclic dicarboxylic acid contained in the alicyclic dicarboxylic acid as the raw material to be 20% by mole or more to the total amount (by mole) of the alicyclic dicarboxylic acid in order to set the amount of the cis-form contained in the alicyclic dicarboxylic acid component unit (h1) to be 20% by mole or more.

Similarly, the proportion of the cis-form contained in the alicyclic diol component unit (h2') is highly depends on the ratio between the cis-form and the trans-form of an alicyclic diol as the raw material. Thus, it is preferred to set the amount (by mole) of the cis-form alicyclic diol contained in the alicyclic diol as the raw material to be 20% by mole or more to the total amount (by mole) of the alicyclic diol in order to set the amount of the cis-form contained in the alicyclic diol component unit (h2') to be 20% by mole or more. The cis/trans ratios of the alicyclic dicarboxylic acid and the alicyclic diol can be determined in the same manner as in determination of the cis/trans ratio of the alicyclic diol component unit in the polyester resin (G) described above. For example, the alicyclic dicarboxylic acid or the alicyclic diol is dissolved in deuterated chloroform:trifluoroacetic acid (volume ratio 4:1) for $^1$H-NMR measurement. The $^1$H-NMR measurement can be performed using, for example, an ECA-500 manufactured by JEOL Ltd. under a condition of 50° C. Data acquired is analyzed to determine the cis/trans ratio of the alicyclic dicarboxylic acid or the alicyclic diol.

Here, the intrinsic viscosity of the polyester resin (H) is adjusted by blending a molecular weight modifier in a reaction system also in preparing the polyester resin (H). The molecular weight modifier may be the same as the molecular weight modifier used in preparing the polyester resin (G) described above. Such a molecular weight modifier is preferably added in an amount of 0.07 mol or less, and more preferably 0.05 mol or less per 1 mol of the total amount of the dicarboxylic acid in the reaction system for the above-described reaction between the dicarboxylic acid and the diol.

B-1-3. White Pigment (J)

The polyester resin composition for a reflective material of the present aspect contains a white pigment (J). The white pigment (J) is not particularly limited as long as the white pigment can whiten the resin composition to enhance a light-reflective function to be obtained by molding the polyester resin composition for a reflective material. Specific examples of the white pigment (J) include titanium oxide, zinc oxide, zinc sulfide, lead white, zinc sulfate, barium sulfate, calcium carbonate, and alumina oxide. The polyester resin composition for a reflective material may contain either only one of these white pigments or two or more thereof. In addition, these white pigments may be treated with a silane coupling agent, titanium coupling agent, or the like. For example, the white pigment may be surface-treated with a silane compound such as vinyltriethoxysilane, 2-aminopropyltriethoxysilane, and 2-glycidoxypropyltriethoxysilane.

The white pigment (J) is particularly preferably titanium oxide. When the polyester resin composition for a reflective material contains titanium oxide, optical properties such as the reflectance and the concealability of a reflective material to be obtained are enhanced. The titanium oxide is preferably a rutile-type titanium oxide. The average particle diameter of the titanium oxide is preferably 0.1 to 0.5 µm, and more preferably 0.15 to 0.3 µm. The average particle diameter is measured with an image analyzer (LUZEX IIIU) or the like on the basis of a transmission electron micrograph.

The white pigment (J) is preferably a white pigment having a small aspect ratio, i.e., having approximately spherical shape, for the purpose of, e.g., uniformizing the reflectance of a reflective material obtained by molding the polyester resin composition for a reflective material.

B-1-4. Inorganic Filler (K)

The polyester resin composition for a reflective material of the present aspect contains an inorganic filler (K). The inorganic filler (K) enhances the strength of a reflective material obtained from the polyester resin composition for a reflective material. The inorganic filler (K) may be various inorganic compound of a shape having a high aspect ratio such as a fibrous, powdery, granular, tabular, needle-like, cloth-like, and mat-like shape.

The average length of the inorganic filler (K) is preferably 10 µm to 10 mm, and more preferably 10 µm to 5 mm. The aspect ratio (aspect ratio=major axis/minor axis) of the inorganic filler (K) is preferably 1 to 500, more preferably 5 to 200, and even more preferably 10 to 350 from the viewpoint of the strength of a reflective material obtained by molding the polyester resin composition for a reflective material, lowering of the coefficient of linear thermal expansion, and the like. The average length and the aspect ratio of the inorganic filler (K) are measured as follows: a resin component is removed from the polyester resin composition for a reflective material or molded article containing the inorganic filler (K) either by dissolving the resin component with a solvent, or by calcination of the composition or the molded article, to thereby separate the inorganic filler (K); and the major axis and the minor axis of the separated inorganic filler (K) are measured using an optical microscope or an electron microscope to calculate the aspect ratio.

Specific examples of the inorganic filler (K) include glass fibers, inorganic compounds having a carbonyl structure (e.g., the whisker of a carbonate such as calcium carbonate), hydrotalcite, titanates such as potassium titanate, wollastonite, and xonotlite. The polyester resin composition for a reflective material may contain only one of them or two or more thereof. When two or more of these inorganic fillers are combined, the dispersibility of the inorganic filler (K) to the polyester resins (G) and (H) may be enhanced. When the dispersibility of the inorganic filler is enhanced, the heat resistance, mechanical strength, or the like of a reflective material obtained from the polyester resin composition for a reflective material is enhanced, and in addition the dispersibility of the white pigment (J) may be improved.

Examples of the inorganic filler having a large average length or aspect ratio include silicates such as wollastonite (calcium silicate), and titanates such as a potassium titanate whisker. Examples of the inorganic filler having a small average length or aspect ratio include inorganic fillers (BW) having a carbonyl group; specifically, e.g., a whisker of a carbonate such as calcium carbonate.

When a glass fiber is contained as the inorganic filler (K), the strength, rigidity, toughness, and the like of a reflective material to be obtained are particularly enhanced. In particular, the thinner the glass fiber is, the more the mechanical properties (in particular thin wall flexural strength) of a reflective material to be obtained are enhanced. In addition, the shrinkage of a reflective material is suppressed.

The average length of the glass fiber contained in the polyester resin composition for a reflective material of the present aspect is preferably 1 μm to 20 mm, more preferably 5 μm to 10 mm, and even more preferably 10 μm to 5 mm from the viewpoint of retaining a satisfactory moldability and enhancing the mechanical properties and heat resistance of a molded article to be obtained. In addition, the aspect ratio of the glass fiber is preferably 5 to 2,000, and more preferably 30 to 600.

The glass fiber may be treated with a silane coupling agent, a titanium coupling agent, or the like. For example, the glass fiber may be surface-treated with a silane compound such as vinyltriethoxysilane, 2-aminopropyltriethoxysilane, and 2-glycidoxypropyltriethoxysilane.

The glass fiber may be coated with a sizing agent. Examples of the preferred sizing agent include acrylic, acrylic/maleic-modified, epoxy, urethane, urethane/maleic-modified, and urethane/epoxy-modified compounds. The glass fiber may be coated with only one of these sizing agents or two or more thereof in combination.

Further, the glass fiber may be treated with both a surface treating agent and a sizing agent. The combined use of the surface treating agent and the sizing agent increases the bonding between the glass fiber and the polyester resin (G), the polyester resin (H), and the like, and as a result a reflective material to be obtained tends to have satisfactory appearance and high strength.

The glass fiber is preferably dispersed uniformly in the polyester resin composition for a reflective material, and is also preferably dispersed uniformly in the reflective material which is a molded article. The uniform dispersion of the glass fiber in the polyester resin composition for a reflective material increases granularity, thus enhancing the mechanical properties of the molded article as well.

B-1-5. Others

The polyester resin composition for a reflective material of the present aspect may contain an arbitrary additive as long as the effect of the present invention is not impaired. Examples of the additive include antioxidants (such as phenols, amines, sulfur, and phosphorus); heat-resistant stabilizers (such as lactone compounds, vitamin E, hydroquinones, copper halides, and iodine compounds); light stabilizers (such as benzotriazoles, triazines, benzophenones, benzoates, hindered amines, and oxanilides); other polymers (such as polyolefins, ethylene-propylene copolymers, olefin copolymers such as an ethylene. 1-butene copolymer, olefin copolymers such as a propylene-1-butene copolymer, polystyrenes, polyamides, polycarbonates, polyacetals, polysulfones, polyphenylene oxides, fluororesins, silicone resins, and LCP); flame retardants (such as bromine-based, chlorine-based, phosphorus-based, antimony-based, and inorganic flame retardants); fluorescent brightening agents; plasticizers; thickeners; antistatic agents; release agents; pigments; crystal nucleating agents; and various known compounding agents.

The polyester resin composition for a reflective material may contain a phosphorus-containing antioxidant. The phosphorus-containing antioxidant is preferably an antioxidant having a $P(OR)_3$ structure. Here, R is an alkyl group, alkylene group, aryl group, arylene group, or the like, and three Rs may be the same or different, or two Rs may form a cyclic structure. Examples of the phosphorus-containing antioxidant include triphenyl phosphite, diphenyl decyl phosphite, phenyl diisodecyl phosphite, tri(nonylphenyl) phosphite, bis(2,4-di-t-butylphenyl) pentaerythritol diphosphite, and bis(2,6-di-t-butyl-4-methylphenyl) pentaerythritol diphosphite. When the phosphorus-containing antioxidant is contained in the resin composition, the decomposition reaction of the polyester resin (G) or the polyester resin (H) is suppressed in a high temperature atmosphere (in particular, under conditions exceeding 250° C. as in the reflow process). As a result, the discoloration of a reflective material obtained by molding the polyester resin composition for a reflective material is suppressed, for example.

When the polyester resin composition for a reflective material of the present aspect is used in combination with other resin compositions or the like, it is preferred to select an additive which does not act on other components contained in the composition (e.g., a compound which cannot be a catalyst poison) as the additive.

B-1-6. Composition of Polyester Resin Composition for Reflective Material

The polyester resin composition for a reflective material of the present aspect contains the polyester resin (H) in an amount of 3 to 30 parts by mass relative to 100 parts by mass of the total of the polyester resin (G), the polyester resin (H), the white pigment (J), and the inorganic filler (K). The amount of the polyester resin (H) is preferably 3 parts by mass or more and less than 25 parts by mass, and more preferably 5 to 20 parts by mass. When the polyester resin (H) is contained in an amount within the range, a reflective material obtained from the resin composition tends to have high reflectivity. However, when the amount of the polyester resin (H) is over 30 parts by mass, the heat resistance of a reflective material is likely to be degraded.

The amount of the polyester resin (G) is preferably 20 parts by mass or more and less than 50 parts by mass, and more preferably 30 to 50 parts by mass relative to 100 parts by mass of the total of the polyester resin (G), the polyester resin (H), the white pigment (J), and the inorganic filler (K). When the amount of the polyester resin (G) is in the range, a reflective material obtained from the resin composition tends to have high heat resistance and dimensional stability.

The amount of the white pigment (J) is preferably 10 parts by mass or more and less than 50 parts by mass, and more preferably 15 to 40 parts by mass relative to 100 parts by mass of the total of the polyester resin (G), the polyester resin (H), the white pigment (J), and the inorganic filler (K). When the amount of the white pigment (J) is in the range, a reflective material obtained from the resin composition tends to have high reflectivity.

The amount of the inorganic filler (K) is preferably 5 parts by mass or more and less than 40 parts by mass, and more preferably 5 to 30 parts by mass relative to 100 parts by mass of the total of the polyester resin (G), the polyester resin (H), the white pigment (J), and the inorganic filler (K). When the amount of the inorganic filler (K) is in the range, a reflective material obtained from the resin composition tends to have high strength.

B-2. Method of Producing Polyester Resin Composition for Reflective Material

The polyester resin composition for a reflective material of the present aspect can be produced by a known method, for example, a method in which the above components are mixed with a Henschel mixer, a V-blender, a ribbon blender, a tumbler blender, or the like, or a method in which, after the mixing, the mixture is further melt-kneaded with a single-screw extruder, a multi-screw extruder, a kneader, a Banbury mixer, or the like and then granulated or ground.

B-3. Application of Polyester Resin Composition for Reflective Material

The reflective material of the present aspect is a molded product obtained by molding the above-described polyester resin composition for a reflective material into an arbitrary shape. The light reflectance of the reflective material is appropriately selected depending on, for example, the ratio of the white pigment (J), and the light reflectance at a wavelength of 450 nm is preferably 80% or higher, more preferably 94% or higher, and even more preferably 95% or higher. When the light reflectance is 80% or higher, the reflective material can be applied to various products for which a high luminance is required. The reflectance is measured using a spectrocolorimeter.

The light reflectance of the reflective material at a wavelength of 450 nm measured after UV ray irradiation at an output of 16 mW/cm$^2$ for 500 hours is preferably 75% or higher, more preferably 88% or higher, and even more preferably 90% or higher. When the light reflectance is 75% or higher, the reflective material can be applied to various products for which a high luminance is required. The reflectance is measured using a spectrocolorimeter. UV ray irradiation can be carried out using, for example, a SUPER WIN MINI manufactured by DAYPLA WINTES CO., LTD.

The reflective material of the present aspect has high heat resistance and light resistance, and further very high reflectance and less lowering of reflectance over time, and thus is suitable as reflective materials for various applications. The reflective material of the present aspect is particularly suitable as a reflective material to reflect a beam from a light source such as a semiconductor laser and a light-emitting diode.

Here, the reflective materials typically include a casing or housing whose surface is open or not open, in which the surface is at least in the light-emitted direction. More specifically, the reflective materials also include a three-dimensional molded article, in general, having a light-reflecting surface (a surface such as a planar surface, a spherical surface, and a curved surface), such as molded articles including a box-like or case-like molded article, a funnel-like molded article, a bowl-like molded article, a parabolic molded article, a cylindrical molded article, a conical molded article, and a honeycomb molded article.

Since the reflective material obtained by using the polyester resin composition for a reflective material of the present aspect is excellent in heat resistance, light resistance, the stability of reflectance over time, and further in toughness, even a thin reflective material is considered to have high possibility of having sufficient strength. Therefore, the reflective material is expected to contribute to the weight reduction and miniaturization of an LED element, or the like.

The most preferable application of the reflective material of the present aspect is as a reflective material for a light-emitting diode element. The reflective material for the light-emitting diode element (LED) of the present aspect is obtained by shaping the polyester resin composition for a reflective material into a desired shape by hot forming such as injection molding, particularly insert molding of metal such as hoop molding, melt molding, extrusion molding, inflation molding, and blow molding. In addition, a light-emitting diode element can be obtained by mounting the LED element and other parts to the reflective material, followed by sealing, joining or bonding with a sealing resin, or the like.

Further, the polyester resin composition for a reflective material and the reflective material of the present aspect can be adapted not only to the LED application, but also to other applications for reflecting a beam. As specific examples, the reflective material of the present aspect can be used as a reflective material for light-emitting apparatuses, such as various electric electronic components, interior illumination, ceiling illumination, exterior illumination, automobile illumination, display equipment, and headlights.

EXAMPLES

Hereinafter, the present invention is described with reference to Examples, which however shall not be construed as limiting the technical scope of the present invention.

A. Example of First Aspect

<Preparation of Polyester Resin (A)>

Polyester resins (A1) to (A7) were prepared according to the following method.

Production Example A-1

143.8 parts of 1,4-cyclohexanedicarboxylic acid (cis/trans ratio: 59/41) (manufactured by Nikko Rica Corporation) and 121.6 parts of 1,4-cyclohexanedimethanol (cis/trans ratio: 25/75) (manufactured by Tokyo Chemical Industry Co., Ltd.) were mixed. To the mixture was added 0.083 part of tetrabutyl titanate, and the temperature was raised from 150° C. to 200° C. over 3 hours to effect an esterification reaction under normal pressure.

After the completion of the above esterification reaction, the pressure was gradually reduced from normal pressure to 1 Torr over 1 hour, and at the same time, the temperature was raised to a predetermined polymerization temperature of 250° C. for a polycondensation reaction. The reaction mixture was stirred continuously while maintaining the temperature and the pressure, and the reaction was terminated when a predetermined stirring torque was reached, and the thus produced polymer (polyester resin (A1)) was taken out from the reaction mixture.

Production Example A-2

A polyester resin (A2) was obtained in substantially the same manner as in Production Example A-1 except that 143.8 parts of 1,4-cyclohexanedicarboxylic acid (cis/trans ratio: 90/10) (manufactured by Nikko Rica Corporation) and 121.6 parts of 1,4-cyclohexanedimethanol (cis/trans ratio: 30/70) (manufactured by Tokyo Chemical Industry Co., Ltd.) were used as the raw materials.

Production Example A-3

A polyester resin (A3) was obtained in substantially the same manner as in Production Example A-1 except that 143.8 parts of 1,4-cyclohexanedicarboxylic acid (cis/trans ratio: 10/90) (manufactured by Nikko Rica Corporation) and 121.6 parts of 1,4-cyclohexanedimethanol (cis/trans ratio: 22/78) (manufactured by Tokyo Chemical Industry Co., Ltd.) were used as the raw materials.

Production Example A-4

A polyester resin (A4) was obtained in substantially the same manner as in Production Example A-1 except that 143.8 parts of 1,4-cyclohexanedicarboxylic acid (cis/trans ratio: 3/97) (manufactured by Nikko Rica Corporation) and 121.6 parts of 1,4-cyclohexanedimethanol (cis/trans ratio: 30/70) (manufactured by Tokyo Chemical Industry Co., Ltd.) were used as the raw materials.

Production Example A-5

106.2 parts of dimethyl terephthalate and 94.6 parts of 1,4-cyclohexanedimethanol (cis/trans ratio: 30/70) (manufactured by Tokyo Chemical Industry Co., Ltd.) were mixed. To the mixture was added 0.0037 part of tetrabutyl titanate, and the temperature was raised from 150° C. to 300° C. over 3 hours and 30 minutes to effect an ester exchange reaction.

At the completion of the above ester exchange reaction, 0.066 part of magnesium acetate tetrahydrate dissolved in 1,4-cyclohexanedimethanol was added thereto, followed by an introduction of 0.1027 part of tetrabutyl titanate for effecting a polycondensation reaction. During the polycondensation reaction, the pressure was gradually reduced from normal pressure to 1 Torr over 85 minutes, and at the same time, the temperature was raised to a predetermined polymerization temperature of 300° C. The reaction mixture was stirred continuously while maintaining the temperature and the pressure, and the reaction was terminated when a predetermined stirring torque was reached. Then, the thus produced polymer was taken out from the reaction mixture. Further, the polymer obtained was subjected to solid phase polymerization at 260° C. and 1 Torr or less for 3 hours to obtain a polymer (polyester resin (A5)).

Production Example A-6

143.8 parts of 1,4-cyclohexanedicarboxylic acid (cis/trans ratio: 59/41) (manufactured by Nikko Rica Corporation) and 121.6 parts of 1,4-cyclohexanedimethanol (cis/trans ratio: 25/75) (manufactured by Tokyo Chemical Industry Co., Ltd.) were mixed. To the mixture was added 0.083 part of tetrabutyl titanate, and the temperature was raised from 150° C. to 200° C. over 1 hour and kept at 200° C. for 3 hours to effect a polycondensation reaction. The reaction mixture was stirred continuously while maintaining the temperature, and the reaction was terminated when a predetermined stirring torque was reached, and then, the thus produced polymer (polyester resin (A6)) was taken out from the reaction mixture.

Production Example A-7

A polyester resin (A7) was obtained in substantially the same manner as in Production Example A-1 except that 143.8 parts of 1,4-cyclohexanedicarboxylic acid (cis/trans ratio: 10/90) (manufactured by Nikko Rica Corporation) and 121.6 parts of 1,4-cyclohexanedimethanol (cis/trans ratio: 30/70) (manufactured by Tokyo Chemical Industry Co., Ltd.) were used as the raw materials.

[Evaluation]

For each of the polyester resins (A1) to (A7) obtained, the ratio (mole ratio) between the cis-form and the trans-form contained in the alicyclic dicarboxylic acid component unit, the ratio (mole ratio) between the cis-form and the trans-form contained in the alicyclic diol component unit, and the melting point, intrinsic viscosity, and Tg of the polyester resin were measured. The results are shown in Table 1. The melting point and intrinsic viscosity of each polyester resin were measured by a differential scanning calorimeter in accordance with JIS-K7121. The mole ratio between the cis-form and the trans-form (cis/trans ratio) and the intrinsic viscosity were measured according to the following method.

(Measurement of Cis/Trans Ratio)

The polyester resins (A1) to (A7) were dissolved in deuterated chloroform:trifluoroacetic acid (volume ratio 4:1) for $^1$H-NMR measurement. The $^1$H-NMR measurement was performed using an ECA-500 manufactured by JEOL Ltd. under a condition of 50° C. The data acquired was analyzed to determine the cis/trans ratio of the alicyclic dicarboxylic acid component unit and the cis/trans ratio of the alicyclic diol component unit.

[Method of Measuring Intrinsic Viscosity]

The polyester resins (A1) to (A7) were dissolved in a 50 mass %/50 mass % mixed solvent of phenol and tetrachloroethane and the falling time (seconds) of the sample solution was measured using an Ubbelohde viscometer under a condition of 25° C.±0.05° C., and the intrinsic viscosity of each polyester resin was calculated from the following equations:

$[\eta] = \eta SP/[C(1+k\eta SP)]$ $[\eta]$: intrinsic viscosity (dl/g)
$\eta SP$: specific viscosity
C: sample concentration (g/dl)
t: falling time (seconds) of sample solution
t0: falling time (seconds) of a solvent
k: constant (slope determined by plotting solution concentration on the ordinate and $\eta SP/C$ on the abscissa, aftemeasuring the specific viscosity of (3 or more) samples having different solution concentrations)

$\eta SP = (t-t0)/t$ r

TABLE 1

|  |  | Production ExampleA-1 Resin(A1) | Production ExampleA-2 Resin(A2) | Production ExampleA-3 Resin(A3) | Production ExampleA-4 Resin(A4) | Production ExampleA-5 Resin(A5) | Production ExampleA-6 Resin(A6) | Production ExampleA-7 Resin(A7) |
|---|---|---|---|---|---|---|---|---|
| Alicyclic Dicarboxylic Acid Component (a1) | Type | 1,4-cyclohexane dicarboxylic acid | 1,4-cyclohexane dicarboxylic acid | 1,4-cyclohexane dicarboxylic acid | 1,4-cyclohexane dicarboxylic acid | Terephthalic Acid | 1,4-cyclohexane dicarboxylic acid | 1,4-cyclohexane dicarboxylic acid |
|  | *[1]Cis/Trans Ratio | 58/42 | 82/18 | 18/82 | 9/91 | — | 62/38 | 17/83 |
| Alicyclic Diol Component (b1) | Type | 1,4-cyclohexane dimethanol | 1,4-cyclohexane dimethanol | 1,4-cyclohexane dimethanol | 1,4-cyclohexane dimethanol | 1,4-cyclohexane dimethanol | 1,4-cyclohexane dimethanol | 1,4-cyclohexane dimethanol |
|  | *[2]Cis/Trans Ratio | 26/74 | 31/69 | 22/78 | 30/70 | 31/69 | 34/66 | 30/70 |
| Melting Point | [° C.] | none | none | 214 | 210 | 288 | none | none |
| Intrinsic Viscosity[η] | [dl/g] | 0.70 | 0.69 | 1.13 | 1.03 | 0.65 | 0.11 | 0.11 |
| Tg | [° C.] | 48 | 47 | 64 | 62 | 86 | 12 | 13 |

*[1]Cis/trans ratio (mole ratio) of alicyclic dicarboxylic acid component unit in polyester resin
*[2]Cis/trans ratio (mole ratio) of alicyclic diol component unit in polyester resin <Preparation of Polyester Resin Composition for Reflective Material>

Polyester resin compositions for a reflective material were prepared according to the following method. The materials other than the polyester resins (A1) to (A5) used in Examples are as follows.

(Raw Materials)

White pigment (B): titanium oxide (powder, average particle diameter*[a]: 0.21 μm)

Glass fiber (C): length of 3 mm, average diameter*[b] (average fiber length) of 6 μm (ECS03T-790DE manufactured by Nippon Electric Glass Co., Ltd.)

Antioxidant (D): ADK STAB PEP-36 (Adeka Corporation)

*[a] The average particle diameter of the white pigment (B) was measured with an image analyzer (LUZEX IIIU) on the basis of a transmission electron micrograph.

*[b] The fiber length was measured for 100 glass fibers by visual observation with an optical microscope and the average value was calculated as the average fiber length of the glass fiber (C).

Example A-1

Using a tumbler blender, 54.5 mass % of the polyester resin (A1), 35.0 mass % of the white pigment (B), 10.0 mass % of the glass fiber (C), and 0.5 mass % of the antioxidant (D) were mixed. The mixture as a raw material was melt-kneaded in a twin-screw extruder (TEX30α manufactured by Japan Steel Works, Ltd.) at a cylinder temperature of 130° C., and then extruded into a strand shape. The extruded strand was cooled in a water tank, pulled out and cut by a pelletizer, thereby obtaining the composition in a pellet shape.

Example A-2

The polyester resin (A1), the white pigment (B), the glass fiber (C), and the antioxidant (D) were put in a plastic container and mixed at a mass ratio shown in Table 2. The mixture as a raw material was melt-kneaded in a Labo Plastomill (4C150 manufactured by Toyo Seiki Seisaku-Sho, Ltd.) at a temperature of 200° C. for 5 minutes, thereby obtaining a resin composition.

Example A-3

A resin composition was obtained in substantially the same manner as in Example A-2 except that the polyester resin (A2) and the white pigment (B) were used at a mass ratio shown in Table 2.

Comparative Example A-1

The polyester resin (A3), the white pigment (B), the glass fiber (C), and the antioxidant (D) were put in a plastic container and mixed at a mass ratio shown in Table 2. The mixture as a raw material was melt-kneaded in a Labo Plastomill (4C150 manufactured by Toyo Seiki Seisaku-Sho, Ltd.) at a temperature of 250° C. for 5 minutes, thereby obtaining a resin composition.

Comparative Example A-2

A resin composition was obtained in substantially the same manner in Comparative Example A-1 except that the polyester resin (A3) was replaced with the polyester resin (A4).

Comparative Example 3

The polyester resin (A5), the white pigment (B), the glass fiber (C), and the antioxidant (D) were mixed using a tumbler blender at a composition ratio shown in Table 2. The mixture as a raw material was melt-kneaded in a twin-screw extruder (TEX30α, manufactured by Japan Steel Works, Ltd.) at a cylinder temperature of 300° C., and then extruded into a strand shape. The extruded strand was cooled in a water tank, pulled out and cut by a pelletizer, thereby obtaining the composition (resin composition) in a pellet shape.

[Evaluation]

The polyester resin compositions for a reflective material prepared in Examples and Comparative Examples were each measured in terms of flexural strength, toughness, and initial reflectance. The results are shown in Table 2.

(Method of Measuring Flexural Strength and Toughness)

Each of the polyester resin compositions for a reflective material obtained in Examples and Comparative Examples was molded under the following molding conditions using an injection molding machine (Tuparl TR40S3A by Sodick Plustech Co., Ltd.) to obtain a test piece. The test piece had a length of 64 mm, a width of 6 mm, and a thickness of 0.8 mm.

The test piece obtained was allowed to stand at a temperature of 23° C. in a nitrogen atmosphere for 24 hours. Next, the test piece was subjected to flexural test in an atmosphere in which a temperature is 23° C. and a humidity is 50% Rh using a flexural test machine AB5 manufactured by INTESCO at a span of 26 mm and a flexural rate of 5 mm/min. The strength and the toughness at the test were measured.

Molding Conditions
(i) Molding Conditions for Examples A-1 to A-3
Molding machine cylinder temperature: 200° C.
Mold temperature: 30° C.
(ii) Molding Conditions for Comparative Examples A-1 and A-2
Molding machine cylinder temperature: 250° C.
Mold temperature: 100° C.
(iii) Molding Conditions for Comparative Example A-3
Molding machine cylinder temperature: 300° C.
Mold temperature: 150° C.
(Method of Measuring Initial Reflectance)

Each of the polyester resin compositions for a reflective material obtained in Examples and Comparative Examples was injection-molded under the following conditions using a molding machine (SE50DU manufactured by Sumitomo Heavy Industries, Ltd.) to obtain a test piece. The test piece had a length of 30 mm, a width of 30 mm, and a thickness of 0.5 mm.

The reflectance in the wavelength region from 380 nm to 740 nm of the test piece was measured using the spectrocolorimeter CM3500d manufactured by Konica Minolta, Inc. The initial reflectance was evaluated using the reflectance at 450 nm as a representative value.

Molding Conditions
(i) Molding Conditions for Examples A-1 to A-3
Molding machine cylinder temperature: 200° C.
Mold temperature: 30° C.
(ii) Molding Conditions for Comparative Examples A-1 and A-2
Molding machine cylinder temperature: 250° C.
Mold temperature: 100° C.
(iii) Molding Conditions for Comparative Example A-3
Molding machine cylinder temperature: 300° C.
Mold temperature: 150° C.

TABLE 2

|  |  |  |  | Ex. A-1 | Ex. A-2 | Ex. A-3 | Comp. Ex. A-1 | Comp. Ex. A-2 | Comp. Ex. A-3 |
|---|---|---|---|---|---|---|---|---|---|
| Composition | Polyester Resin (A) | Type | | (A1) | (A1) | (A2) | (A3) | (A4) | (A5) |
|  |  | mass % | | 54.5 | 69.5 | 54.5 | 54.5 | 54.5 | 54.5 |
|  |  | *Cis/Trans Ratio | | 58/42 | 58/42 | 82/18 | 18/82 | 9/91 | — |
|  | White Pigment (B) | mass % | | 35 | 20 | 35 | 35 | 35 | 35 |
|  | Glass Fiber (C) | mass % | | 10 | 10 | 10 | 10 | 10 | 10 |
|  | Antioxidant (D) | mass % | | 0.5 | 0.5 | 0.5 | 0.5 | 0.5 | 0.5 |
| Evaluation | Flexural Strength | MPa | | 86 | 88 | 87 | 88 | 86 | 105 |
|  | Flexural Test (Toughness) | mJ | | 25 | 28 | 26 | 24 | 23 | 17 |
|  | Initial Reflectance | 450 nm | % | 96.6 | 95.9 | 96.8 | 93.4 | 93.6 | 94.2 |
|  |  | 550 nm | % | 97.2 | 96.4 | 97.4 | 95.4 | 95.5 | 95.8 |

*Cis/trans ratio (mole ratio) of alicyclic dicarboxylic acid component unit (a1) in polyester resin (A)

As shown in the above Table 2, in the case that the proportion of the cis-form contained in the alicyclic dicarboxylic acid component unit (a1) in the polyester resin (A) was 20% by mole or more (Examples A-1 to A-3), the initial light reflectances at wavelengths of 450 nm and 550 nm were higher than those in the case that the proportion of the cis-form was less than 20% by mole (Comparative Examples A-1 and A-2). The polyester resins (A1) and (A2) contained in these Examples each had no melting point and were amorphous, and it is inferred that this allowed the resin composition to have high reflectance.

<Preparation of Crosslinked Polyester Resin Composition for Reflective Material>

Crosslinked polyester resin compositions for a reflective material were prepared according to the following method. Materials other than the polyester resins (A6) and (A7) used in Examples are as follows. For a white pigment (B), a glass fiber (C), and an antioxidant (D), materials used were as the same as those used in preparation of the above-described polyester resin compositions for a reflective material.

(Raw Materials)
Peroxide (E): Perhexa(Registered Trademark) HC (manufactured by NOF Corporation)
Crosslinking auxiliary agent (F1): TAIC(Registered Trademark) triisocyanurate (manufactured by Nippon Kasei Chemical Co., Ltd.)
Crosslinking auxiliary agent (F2): SR295 (manufactured by Sartomer Co.)

Example A-4

The polyester resin (A6), the white pigment (B), the glass fiber (C), the antioxidant (D), the peroxide (E), and the crosslinking auxiliary agent (F1) were put in a plastic container and mixed at a mass ratio shown in Table 3. The mixture as a raw material was melt-kneaded in a Labo Plastomill (4C150 manufactured by Toyo Seiki Seisaku-Sho, Ltd.) at a temperature of 100° C. for 5 minutes. Thereafter, the resultant was pressed into a sheet shape using a press machine to obtain a sheet of a crosslinked polyester resin composition for a reflective material containing a crosslinked polyester resin (A').

Examples A-5 to A-14 and Comparative Example A-4

Crosslinked polyester resin compositions for a reflective material containing a crosslinked polyester resin (A') were obtained in substantially the same manner as in Example A-4 except that the polyester resin (A), the white pigment (B), the glass fiber (C), the antioxidant (D), the peroxide (E), and the crosslinking auxiliary agent (F1) or (F2) were used at a mass ratio shown in Table 3.

[Evaluation]

For the crosslinked polyester resin compositions for a reflective material obtained in Examples A-4 to A-14 and Comparative Example A-4, the reflectances were measured, and the resistance to soldering heat was evaluated by using the following criteria. The results are shown in Table 3.

Output: 16 mW/cm$^2$
(Evaluation of Heat Resistance)
The test piece after the initial reflectance measurement was allowed to stand in an oven at 150° C. for 1 minute. After being slowly cooled, the test piece was visually observed and evaluated by using the following criteria.
Evaluation Criteria
A: No change was found in the shape of the test piece after a heating process
B: A part of the test piece changed while the skeleton was maintained after a heating process
C: The whole test piece melted and the shape significantly changed after a heating process

TABLE 3

| | | | Ex. A-4 | Ex. A-5 | Ex. A-6 | Ex. A-7 | Ex. A-8 | Ex. A-9 | Ex. A-10 | Ex. A-11 | Ex. A-12 | Ex. A-13 | Ex. A-14 | Comp. Ex. A-4 |
|---|---|---|---|---|---|---|---|---|---|---|---|---|---|---|
| Composition | Polyester Resin (A) | Type | (A6) | (A6) | (A6) | (A6) | (A6) | (A6) | (A6) | (A6) | (A6) | (A6) | (A6) | (A7) |
| | | mass % | 52.5 | 48.5 | 23.5 | 23.5 | 23.5 | 23.5 | 54.5 | 53.5 | 53.5 | 49.45 | 53.5 | 54.5 |
| | | *Cis/Trans Ratio | 62/38 | 62/38 | 62/38 | 62/38 | 62/38 | 62/38 | 62/38 | 62/38 | 62/38 | 62/38 | 62/38 | 17/83 |
| | White Pigment (B) | mass % | 35 | 35 | 35 | 35 | 35 | 35 | 35 | 35 | 35 | 35 | 35 | 35 |
| | Glass Fiber (C) | mass % | 10 | 10 | 35 | 35 | 35 | 35 | 10 | 10 | 10 | 10 | 10 | 10 |
| | Antioxidant (D) | mass % | 0.5 | 0.5 | 0.5 | 0.5 | 0.5 | 0.5 | 0.5 | 0.5 | 0.5 | 0.5 | 0.5 | 0.5 |
| | Peroxide (E) | mass % | 1 | 1 | 1 | 1 | 1 | 5 | | 1 | | 0.05 | 1 | |
| | Crosslinking Auxiliary Agent (F1) | mass % | 1 | 5 | 5 | 10 | | 5 | | | 1 | 5 | 0.05 | |
| | Crosslinking Auxiliary Agent (F2) | mass % | | | | | 7.5 | | | | | | | |
| Evaluation | Reflectance at Wavelength of 450 nm | Initial (%) | 96.1 | 95.8 | 94.3 | 93.8 | 94.1 | 93.4 | 96.6 | 96.4 | 96.4 | 95.7 | 96.3 | 93.1 |
| | | After UV Ray Irradiation (%) | 94.4 | 94.2 | 92.8 | 92.5 | 92.7 | 92 | Deformed | Deformed | Deformed | Deformed | Deformed | Deformed |
| | Rating of Heat Resistance | — | A | A | A | A | A | A | B | B | B | B | B | B |

*Cis/trans ratio (mole ratio) of alicyclic dicarboxylic acid component unit (a1) in polyester resin (A)

[Method of Measuring Initial Reflectance]
Each of the above-described sheet-shaped polyester resin compositions for a reflective material was molded under the following conditions using a hot press machine (manufactured by SHINTO Metal Industries Corporation). The test piece had a length of 45 mm, a width of 45 mm, and a thickness of 0.5 mm. The reflectance in the wavelength region from 360 nm to 740 nm of the test piece was measured using the spectrocolorimeter CM3500d manufactured by Konica Minolta, Inc. The initial reflectance was evaluated using the reflectance at 450 nm as a representative value.
Pressing Conditions
Mold temperature: 200° C.
Pressing time: 5 minutes
[Method of Measuring Reflectance after UV Ray Irradiation]
The test piece after the initial reflectance measurement was irradiated with a UV ray for 500 hours in the following UV irradiator. Thereafter, the reflectance of the resultant test piece was measured according to the same method as in the measurement of initial reflectance, and the measurement was used as the reflectance after UV ray irradiation.
UV Ray Irradiation Conditions
UV irradiator: SUPER WIN MINI manufactured by DAY-PLA WINTES CO., LTD.

As shown in the above Table 3, in Examples A-10 to A-12, in which the peroxide (E) and the crosslinking auxiliary agent (F) were not contained or either one of them was contained, and in Examples A-13 and A-14, in which the amount of the peroxide (E) or the crosslinking auxiliary agent (F) was small, deformation or the like tended to occur due to the UV ray irradiation or heat resistance test, although the initial reflectance was excellent. In contrast, the crosslinked polyester resin compositions for a reflective material which contained the peroxide (E) and the crosslinking auxiliary agent (F) and in which the polyester resin (A) was crosslinked (Examples A-4 to A-9) underwent less lowering of reflectance even after the UV ray irradiation, and further had an excellent rating of heat resistance.

In Comparative Example A-4, in which the amount of the cis-form contained in the alicyclic dicarboxylic acid component unit in the polyester resin (A) was small, even the initial reflectance was low.

B. Examples of Second Aspect

<Preparation of Polyester Resins (G) and (H)>

The polyester resin (G) and the polyester resin (H) were prepared according to the following method.

Production Example B-1

106.2 parts of dimethyl terephthalate and 94.6 parts of 1,4-cyclohexanedimethanol (cis/trans ratio: 30/70) (manufactured by Tokyo Chemical Industry Co., Ltd.) were mixed. To the mixture was added 0.0037 part of tetrabutyl titanate, and the temperature was raised from 150° C. to 300° C. over 3 hours and 30 minutes to effect an ester exchange reaction.

At the completion of the above ester exchange reaction, 0.066 part of magnesium acetate tetrahydrate dissolved in 1,4-cyclohexanedimethanol was added thereto, followed by an introduction of 0.1027 part of tetrabutyl titanate for effecting a polycondensation reaction. During the polycondensation reaction, the pressure was gradually reduced from normal pressure to 1 Torr over 85 minutes, and at the same time, the temperature was raised to a predetermined polymerization temperature of 300° C. The reaction mixture was stirred continuously while maintaining the temperature and the pressure, and the reaction was terminated when a predetermined stirring torque was reached. Then, the thus produced polymer was taken out from the reaction mixture. Further, the polymer obtained was subjected to solid phase polymerization at 260° C. and 1 Torr or less for 3 hours to obtain a polymer (polyester resin (G)).

Production Example B-2

143.8 parts of 1,4-cyclohexanedicarboxylic acid (cis/trans ratio: 59/41) (manufactured by Nikko Rica Corporation) and 121.6 parts of 1,4-cyclohexanedimethanol (cis/trans ratio: 25/75) (manufactured by Tokyo Chemical Industry Co., Ltd.) were mixed. To the mixture was added 0.083 part of tetrabutyl titanate, and the temperature was raised from 150° C. to 200° C. over 3 hour to effect an esterification reaction under normal pressure.

After the completion of the above esterification reaction, the pressure was gradually reduced from normal pressure to 1 Torr over 1 hour, and at the same time, the temperature was raised to a predetermined polymerization temperature of 250° C. for a polycondensation reaction. The reaction mixture was stirred continuously while maintaining the temperature and the pressure, and the reaction was terminated when a predetermined stirring torque was reached, and the thus produced polymer (polyester resin (H)) was taken out from the reaction mixture.

[Evaluation]

For the polyester resins (G) and (H) obtained, the melting point, Tg, and the intrinsic viscosity were measured according to the following method. The melting point and Tg of each of the polyester resins was measured by a differential scanning calorimeter in accordance with JIS-K7121. The intrinsic viscosity was measured according to the following method. Further, the ratio (mole ratio) between the cis-form and the trans-form contained in the alicyclic diol component unit in the polyester resin (H) was measured according to the following method. The results are shown in Table 4.

(Melting Point and Tg)

The melting point and Tg of each of the polyester resins (G) and (H) were measured in accordance with JIS-K7121. X-DSC7000 (manufactured by SII) was prepared as a measurement apparatus. To this apparatus was set a pan for DSC measurement in which the sample of the polyester resin (G) or (H) was encapsulated, and the temperature was raised to 320° C. at a temperature-raising rate of 10° C./min in a nitrogen atmosphere and retained at the temperature for 5 minutes, and thereafter lowered to 30° C. at a temperature-lowering rate of 10° C./min. Then, the peak top temperature of the endothermic peak during raising the temperature was used as the "melting point", and the intersection between the base line and the tangent line at the inflexion point was used as "Tg".

(Method of Measuring Intrinsic Viscosity)

The polyester resins (G) and (H) were dissolved in a 50 mass %/50 mass % mixed solvent of phenol and tetrachloroethane and the falling time (seconds) of the sample solution was measured using an Ubbelohde viscometer under a condition of 25° C.±0.05° C., and the intrinsic viscosity of each polyester resin was calculated from the following equations:

$$[\eta] = \eta SP/[C(1+k\eta SP)]$$

[η]: intrinsic viscosity (dl/g)
ηSP: specific viscosity
C: sample concentration (g/dl)
t: falling time (seconds) of sample solution
t0: falling time (seconds) of a solvent
k: constant (slope determined by plotting solution concentration on the ordinate and ηSP/C on the abscissa, after measuring the specific viscosity of (3 or more) samples having different solution concentrations)

$$\eta SP = (t-t0)/t0$$

(Method of Measuring Ratio Between Cis-Form and Trans-Form (Cis/Trans Ratio) Contained in Alicyclic Diol Component Unit in Polyester Resins (G) and (H))

The polyester resin (G) or (H) was dissolved in deuterated chloroform:trifluoroacetic acid (volume ratio 4:1) for $^1$H-NMR measurement to measure the cis/trans ratio (mole ratio). The $^1$H-NMR measurement was performed using an ECA-500 manufactured by JEOL Ltd. under a condition of 50° C. The data acquired was analyzed to determine the cis/trans ratio of the alicyclic diol component unit.

TABLE 4

| | Melting Point (° C.) | Tg (° C.) | Intrinsic Viscosity (dl/g) | Cis/Trans Ratio in Alicyclic Diol Component Unit (Mole Ratio) |
|---|---|---|---|---|
| Polyester Resin (G) | 290 | 86 | 0.65 | 32/68 |
| Polyester Resin (H) | — | 50 | 0.7 | 31/69 |

<Preparation of Polyester Resin Composition for Reflective Material>

The polyester resin compositions for a reflective material were prepared according to the following method. Materials other than the polyester resins (G) and (H) used in Examples are as follows.

(Raw Materials)

White pigment (J): titanium oxide (powder, average particle diameter*[a]: 0.21 μm)

Inorganic filler (glass fiber) (K): a length of 3 mm, an average diameter*[b] (average fiber length) of 6 μm (ECS03T-790DE manufactured by Nippon Electric Glass Co., Ltd.)

Antioxidant: IRGANOX 1010 (BASF) pentaerythritol tetrakis [3-(3,5-di-tert-butyl-4-hydroxyphenyl)propionate]

*[a] The average particle diameter of the white pigment (J) was measured with an image analyzer (LUZEX IIIU) on the basis of a transmission electron micrograph.

Example B-1

Using a tumbler blender, 49.2 parts by mass of the polyester resin (G) prepared according to the above-described method, 5.5 parts by mass of the polyester resin (H) prepared according to the above-described method, 35 parts by mass of the white pigment (titanium oxide) (J), 10 parts by mass of the inorganic filler (glass fiber) (K), and 0.3 part by mass of the antioxidant were mixed. The resultant mixture as a raw material was melt-kneaded in a twin-screw extruder (TEX30α manufactured by Japan Steel Works, Ltd.) at a cylinder temperature of 300° C. The kneaded product was then extruded into a strand shape. The extruded strand was cooled in a water tank, pulled out and cut by a pelletizer, thereby obtaining a resin composition in a pellet shape for a reflective material. The mixing uniformity (compoundability) of the composition was satisfactory.

Examples B-2 and B-3 and Comparative Example B-1 and Reference Example B-2

Polyester resin compositions in a pellet shape for a reflective material were obtained in substantially the same manner as in Example B-1 except that each composition was changed as shown in the following Table 5.

Reference Example B-3

A polyester resin composition in a pellet shape for a reflective material was obtained in substantially the same manner as in Example B-1 except that the cylinder temperature was changed to 130° C. and the composition was changed as shown in Table 5.

[Evaluation]

For the resin compositions obtained in Examples and Comparative Examples, various reflectances and flexural strength were measured, and the resistance to reflow soldering heat was evaluated by using the following criteria. FIG. 1 shows a graph in which the reflectances (initial reflectance and reflectance after 500 h UV ray irradiation) are plotted against the proportion of the polyester resin (H) contained in each of the polyester resin compositions for a reflective material in Examples B-1 to B-3 and Comparative Example B-1.

<Reflectance>

(Initial Reflectance)

Each of the polyester resin compositions in a pellet shape for a reflective material was injection-molded under the following conditions using the following molding machine. The test piece had a length of 30 mm, a width of 30 mm, and a thickness of 0.5 mm. The test piece obtained was determined in term of reflectance in the wavelength region from 360 nm to 740 nm using a CM3500d manufactured by Minolta, Co., Ltd. The reflectance at 450 nm was used as a representative value for the initial reflectance.

Molding machine: SE50DU manufactured by Sumitomo Heavy Industries, Ltd.

Molding Conditions (i) Molding Conditions for Examples B-1 to B-3, Comparative Example B-1, and Reference Example B-2

Molding machine cylinder temperature: 300° C.

Mold temperature: 150° C.

(ii) Molding Conditions for Reference Example B-3

Molding machine cylinder temperature: 200° C.

Mold temperature: 30° C.

(Reflectance after UV Ray Irradiation)

The test piece after the initial reflectance measurement was irradiated with a UV ray for 500 hours in the following UV irradiator. Thereafter, the reflectance of the resultant test piece was measured according to the same method as in the measurement of initial reflectance, and the measurement was used as the reflectance after UV ray irradiation.

UV irradiator: SUPER WIN MINI manufactured by DAYPLA WINTES CO., LTD.

Output: 16 mW/cm$^2$

<Method of Measuring Flexural Strength>

Each of the polyester resin compositions for a reflective material obtained in Examples and Comparative Examples was molded under the following molding conditions using an injection molding machine (Tuparl TR40S3A by Sodick Plustech Co., Ltd.) to obtain a test piece. The test piece had a length of 64 mm, a width of 6 mm, and a thickness of 0.8 mm.

The test piece obtained was allowed to stand at a temperature of 23° C. in a nitrogen atmosphere for 24 hours. Next, the test piece was subjected to flexural test in an atmosphere in which a temperature is 23° C. and a humidity is 50% Rh using a flexural test machine AB5 manufactured by INTESCO at a span of 26 mm and a flexural rate of 5 mm/min, and the strength at the test was measured.

Molding Conditions (i) Molding Conditions for Examples B-1 to B-3, Comparative Example B-1, and Reference Example B-2

Molding machine cylinder temperature: 300° C.

Mold temperature: 150° C.

(ii) Molding Conditions for Reference Example B-3

Molding machine cylinder temperature: 200° C.

Mold temperature: 30° C.

<Evaluation of Resistance to Reflow Soldering Heat>

The test piece after the initial reflectance measurement was subjected to a heat treatment with a temperature profile to set the surface temperature of the test piece to 260° C. and retain at the temperature for 20 seconds (the heat treatment performed in a reflow soldering process) using an air reflow soldering apparatus (AIS-20-82-C manufactured by Eightech Tectron Ltd., Co.). After being slowly cooled, the test piece was visually observed and evaluated by using the following criteria.

Evaluation Criteria

A: No change was found in the shape of the test piece after a reflow heating process B: No change was found in the shape of the test piece after a reflow heating process but the surface was roughened C: A part of the test piece melted after a reflow heating process D: The test piece melted and the shape changed after a reflow heating process

*$^b$ The fiber length was measured for 100 glass fibers by visual observation with an optical microscope and the average value was calculated as the average fiber length of the glass fiber (K).

TABLE 5

| | Unit | Ex. B-1 | Ex. B-2 | Ex. B-3 | Comp. Ex. B-1 | Ref. Ex. B-2 | Ref. Ex. B-3 |
|---|---|---|---|---|---|---|---|
| Polyester Resin (G) | mass % | 49.2 | 38.3 | 27.4 | 54.7 | 16.4 | 0 |
| Polyester Resin (H) | mass % | 5.5 | 16.4 | 27.3 | 0 | 38.3 | 54.7 |
| White Pigment (J) | mass % | 35 | 35 | 35 | 35 | 35 | 35 |
| Inorganic Filler (K) | mass % | 10 | 10 | 10 | 10 | 10 | 10 |
| Antioxidant (L) | mass % | 0.3 | 0.3 | 0.3 | 0.3 | 0.3 | 0.3 |
| Mass Ratio H/(G + H + K + L) | Part by Mass | 5.5 | 16.4 | 27.4 | 0.0 | 38.4 | 54.9 |
| Reflectance | Initial %[450 nm] | 94.8 | 95.0 | 95.5 | 94.3 | 95.7 | 96.0 |
| | After UV Ray Irradiation 16 mW/cm$^2$ × 500 h %[450 nm] | 89 | 90.3 | 91.8 | 86.8 | Unmeasurable (melted) | Unmeasurable (melted) |
| Flexural Strength | MPa | 97 | 95 | 93 | 107 | 90 | 86 |
| Rating of Resistance to Reflow Soldering Heat | — | A | A | B | A | C | D |

As shown in the above Table 5 and FIG. 1, the polyester resin compositions for a reflective material in which the amount of the polyester resin (H) was 3 parts by mass or more relative to 100 parts by mass of the total of the polyester resin (G), the polyester resin (H), the white pigment (J), and the inorganic filler (K) (Examples B-1 to B-3), not only had high initial reflectance, but also exhibited a reflectance after UV ray irradiation of 89.0% or higher, which was a value significantly higher than that in Comparative Example 1. However, in the case that the amount of the polyester resin (H) was over 30 parts by mass (Reference Example B-2 and Reference Example B-3), the initial reflectance was high, but the rating of resistance to reflow soldering heat was low and further melting tended to occur due to UV ray irradiation. That is, the heat resistance tended to be lowered.

INDUSTRIAL APPLICABILITY

This application claims priority based on Japanese patent Application Nos. 2014-072275, filed on Mar. 31, 2014, 2014-170545 filed on Aug. 25, 2014 and 2014-250260 filed on Dec. 10, 2014, the entire contents of which including the specifications and the drawings are incorporated herein by reference.

The molded product of the polyester resin composition for a reflective material of the present invention has high reflectance. Accordingly, the polyester resin composition for a reflective material of the present invention can be applied to a reflective material for various illumination apparatuses or the like.

The invention claimed is:

1. A polyester resin composition for a reflective material comprising: a polyester resin (A) containing an alicyclic dicarboxylic acid component unit (a1) derived from an alicyclic dicarboxylic acid and an aliphatic diol component unit (b1) derived from an aliphatic diol; and a white pigment (B), wherein
    an amount of the alicyclic dicarboxylic acid component unit (a1) is 50% by mole or more based on an amount of a total dicarboxylic acid component unit (a) in the polyester resin (A),
    an amount of the aliphatic diol component unit (b1) is 50% by mole or more based on an amount of a total diol component unit (b) in the polyester resin (A), and
    the alicyclic dicarboxylic acid component unit (a1) contains cis-trans isomers in cis-form and trans-form, and a proportion of the cis-form measured by NMR is 50% by mole or more.

2. The polyester resin composition for a reflective material according to claim 1, wherein
    the aliphatic diol component unit (b1) contains an alicyclic diol component unit (b1') derived from an alicyclic diol, and
    the alicyclic diol component unit (b1') contains cis-trans isomers in cis-form and trans-form, and a proportion of the cis-form measured by NMR is 20% by mole or more and 50% by mole or less.

3. The polyester resin composition for a reflective material according to claim 1, wherein
    the alicyclic dicarboxylic acid component unit (a1) contains 30 to 100% by mole of a cyclohexanedicarboxylic acid component unit (a1-1) and 0 to 70% by mole of an alicyclic dicarboxylic acid component unit (a1-2) exclusive of the cyclohexanedicarboxylic acid component unit, wherein a total of the cyclohexanedicarboxylic acid component unit (a1-1) and the alicyclic dicarboxylic acid component unit (a1-2) is 100% by mole, and
    the aliphatic diol component unit (b1) contains 30% by mole to 100% by mole of a cyclohexanedimethanol component unit (b1-1) and 0 to 70% by mole of an aliphatic diol component unit (b1-2) exclusive of the cyclohexanedimethanol component unit, wherein a total of the cyclohexanedimethanol component unit (b1-1) and the aliphatic diol component unit (b1-2) is 100% by mole.

4. The polyester resin composition for a reflective material according to claim 1, wherein the alicyclic dicarboxylic acid component unit (a1) contains a 1,4-cyclohexanedicarboxylic acid component unit derived from 1,4-cyclohexanedicarboxylic acid, and the aliphatic diol component unit (b1) contains a 1,4-cyclohexanedimethanol component unit derived from 1,4-cyclohexanedimethanol.

5. The polyester resin composition for a reflective material according to claim 1, wherein a content of the polyester resin (A) is 20 mass % or more and less than 80 mass % based on a total mass of the polyester resin composition for a reflective material, and
    a content of the white pigment (B) is 5 mass % or more and less than 50 mass % based on the total mass of the polyester resin composition for a reflective material.

6. The polyester resin composition for a reflective material according to claim 1, wherein the polyester resin (A) has no melting point (Tm) as measured by a differential scanning calorimeter in accordance with JIS-K7121.

7. The polyester resin composition for a reflective material according to claim 1, wherein the polyester resin (A) has an intrinsic viscosity [η] of 0.05 to 10 dl/g.

8. The polyester resin composition for a reflective material according to claim 1, further comprising 0.1 to 30 parts by mass of a peroxide (E) and 0.1 to 50 parts by mass of a crosslinking auxiliary agent (F) relative to 100 parts by mass of the polyester resin (A).

9. The polyester resin composition for a reflective material according to claim 8, wherein the crosslinking auxiliary agent (F) is a compound having one or more ethylenically-unsaturated bonds in one molecule.

10. The polyester resin composition for a reflective material according to claim 9, wherein the crosslinking auxiliary agent (F) is a compound having two or more ethylenically-unsaturated bonds and a triazine skeleton in one molecule.

11. A crosslinked polyester resin composition for a reflective material obtained by melt-kneading the polyester resin composition for a reflective material according to claim 8, the crosslinked polyester resin composition containing a crosslinked polyester resin (A') which is at least partially crosslinked polyester resin (A).

12. A reflective material comprising the crosslinked polyester resin composition for a reflective material according to claim 11.

13. The reflective material according to claim 12, which is a reflective material for a light-emitting diode element.

14. A reflective material comprising the polyester resin composition for a reflective material according to claim 1.

15. The reflective material according to claim 14, which is a reflective material for a light-emitting diode element.

* * * * *